(12) United States Patent
Kinoshita et al.

(10) Patent No.: US 7,521,752 B2
(45) Date of Patent: Apr. 21, 2009

(54) FIN-TYPE CHANNEL TRANSISTOR AND METHOD OF MANUFACTURING THE SAME

(75) Inventors: Atsuhiro Kinoshita, Kamakura (JP); Junji Koga, Yokosuka (JP); Yukio Nakabayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 443 days.

(21) Appl. No.: 11/384,269

(22) Filed: Mar. 21, 2006

(65) Prior Publication Data

US 2006/0220131 A1 Oct. 5, 2006

(30) Foreign Application Priority Data

Mar. 28, 2005 (JP) .............................. 2005-092267
Feb. 3, 2006 (JP) .............................. 2006-027300

(51) Int. Cl.
*H01L 27/108* (2006.01)
*H01L 29/94* (2006.01)

(52) U.S. Cl. ..................... 257/329; 257/347; 257/302; 257/306

(58) Field of Classification Search .................. 257/329, 257/255, 347, 208, 328, 302, 308; 438/268, 438/167, 192
See application file for complete search history.

(56) References Cited

U.S. PATENT DOCUMENTS 6,750,487 B2* 6/2004 Fried et al. ................. 257/270
6,995,456 B2* 2/2006 Nowak ....................... 257/627
7,365,401 B2* 4/2008 Anderson et al. ........... 257/401

OTHER PUBLICATIONS

Yang-Kyu Choi et al., "FinFET Process Refinements for Improved Mobility and Gate Work Function Engineering," Tech. Dig. IEDM 2002, pp. 259-262 (2002).

* cited by examiner

*Primary Examiner*—Chuong A. Luu
(74) *Attorney, Agent, or Firm*—Finnegan, Henderson, Farabow, Garrett & Dunner, L.L.P.

(57) ABSTRACT

It is possible to reliably implant an impurity into an impurity forming region, and to form a self-aligned silicides on the entire portion of the source and drain regions. There are provided: a first semiconductor layer of a first conductivity type in a substantially a rectangular solid shape formed on a substrate; a gate electrode formed on a pair of first side portions of the first semiconductor layer facing to each other with a gate insulating film being placed between the gate electrode and the first side portions; a second semiconductor layer of the first conductivity type connected to bottom portions of a pair of second side portions of the first semiconductor layer placed in a substantially perpendicular direction with respect to the first side portions, the second semiconductor layer extending along the substantially perpendicular direction; a first impurity region of a second conductivity type formed in the second semiconductor layer; second impurity regions formed on the pair of side portions of the first semiconductor layer and connected to the first impurity region; and a channel region formed between the second impurity regions of the first semiconductor layer.

11 Claims, 26 Drawing Sheets

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

C-C SECTION

A-A SECTION

B-B SECTION

A-A SECTION

B-B SECTION

A-A SECTION

A-A SECTION

A-A SECTION

A-A SECTION

A-A SECTION

B-B SECTION

A-A SECTION

B-B SECTION

A-A SECTION

A-A SECTION

B-B SECTION

A-A SECTION

B-B SECTION

A-A SECTION

B-B SECTION

FIN-TYPE CHANNEL TRANSISTOR AND METHOD OF MANUFACTURING THE SAME

CROSS-REFERENCE TO RELATED APPLICATION

This application is based upon and claims the benefit of priority from prior Japanese Patent Application Nos. 2005-92267 and 2006-27300, filed on Mar. 28, 2005 and Feb. 3, 2006, the entire contents of which are incorporated herein by reference.

BACKGROUND OF THE INVENTION

1. Field of the Invention

The present invention relates to a Fin-type channel transistor and a method of manufacturing the same.

2. Background Art

In order to improve the performance of semiconductor integrated circuits, it is necessary to improve the performance of field effect transistors constituting each semiconductor integrated circuit. So far, the device performance has been improved by miniaturizing the devices. However, some point out the limitations of this method. Countermeasures to short channel effect and a decrease in parasitic resistance are considered to be serious problems. According to the International Semiconductor Roadmap, a plurality of new breakthrough techniques would be required to solve such problems in the 45 nm generation or later.

Under such a circumstance, an FD (Fully-Depleted) device, in which the channel region is fully depleted, is expected to constitute a basic device structure in the next generation because of its immunity to the short channel effect. In particular, attention is being given to a transistor using a thin film SOI (Silicon On Insulator) substrate and a Fin-type channel transistor (hereinafter referred to as "Fin-FET").

As a countermeasure to the depletion of gate electrodes, replacement of gate material by a metal or metal silicide (metal gate) is considered. In particular, full replacement of the gate material, i.e., polycrystalline silicon, by a metal silicide (full silicidation) is attracting attention from the viewpoints of the thermal stability during the process of manufacturing the device and the cost of manufacturing the device.

A Fin-type channel transistor, which has a channel in a shape of plate standing on a substrate in a perpendicular manner, is a kind of multigate transistors, and called "Fin-type channel transistor" from its channel shape. It is highly of immunity to the short channel effect because of its strong gate dominance. In the ITRS, this type of transistor is explained in the chapter relating to Emerging Research Devices (Y. K. Choi et al. "FinFET Process Refinements for Improved Mobility and Gate Work Function Engineering", Technical Digest of International Electron Devices Meeting (IEDM) (December 2002), page 259).

Thus, a Fin-type channel transistor has a structure very promising to deal with the short channel effect. However, because of the structural complication, there are the following three problems arising in the process of manufacturing a Fin-type channel transistor.

First, when an extension layer, a halo layer, and a deep region are formed by ion implantation, it is difficult to introduce the impurity under the target Fin because of the existence of adjacent Fins, which renders it difficult to control the impurity profile.

Second, when a gate sidewall is formed, the sidewall material may remain on the channel Fins, which may reduce the resistance-decreasing effect of the self-aligned silicide.

Third, since the thickness of polycrystalline silicon at the upper surface of Fins differs from the thickness thereof at the portions between adjacent Fins, the amount of a metal provided is determined by the thicker portion. As a result, a too much amount of the metal is provided to the portions, in which the thickness of polycrystalline silicon is thinner, some silicides may move over the gate sidewall during the silicidation process and may cause the bridging between gate and source/drain.

Due to the aforementioned problems in the manufacturing process, actual Fin-type channel transistors have problems in that the parasitic resistances vary, the device characteristics vary, and the heights of Fins cannot be increased to improve the drive current capability.

SUMMARY OF THE INVENTION

The present invention is proposed in consideration of the aforementioned circumstances, and it is an object of the present invention to provide a Fin-type channel transistor, in which an impurity can be reliably implanted into an impurity forming region, and a self-aligned silicide (salicide) can be formed on the entire source and drain regions.

A Fin-type channel transistor according to a first aspect of the present invention includes:

a first semiconductor layer of a first conductivity type in a substantially a rectangular solid shape formed on a substrate;

a gate electrode formed on a pair of first side portions of the first semiconductor layer facing to each other with a gate insulating film being placed between the gate electrode and the first side portions;

a second semiconductor layer of the first conductivity type connected to bottom portions of a pair of second side portions of the first semiconductor layer placed in a substantially perpendicular direction with respect to the first side portions, the second semiconductor layer extending along the substantially perpendicular direction;

a first impurity region of a second conductivity type formed in the second semiconductor layer;

second impurity regions formed on the pair of side portions of the first semiconductor layer and connected to the first impurity region; and a channel region formed between the second impurity regions of the first semiconductor layer.

A protection layer of an insulating material can be formed on an upper surface of the first semiconductor layer, the gate electrode formed on the pair of first side portions of the first semiconductor layer can extend on the protection layer, and sidewalls of an insulating material can be formed on side portions of the gate electrode which are in parallel with the second side portions of the first semiconductor layer.

The first semiconductor layer can include a plurality of first semiconductor layers arranged in a line in a direction perpendicular to the pair of first side portions, and portions of the gate electrode can be inserted between adjacent semiconductor layers.

The substrate can be an SOI substrate, the first impurity region can be formed in an SOI layer of the SOI substrate, and the second impurity regions can be of the second conductivity type.

The substrate can be a bulk silicon substrate, and the first impurity region can be formed in the bulk silicon substrate.

A silicon or silicon germanium epitaxial layer can be formed on a surface of the first impurity region.

A metal layer having a Schottky junction with the first semiconductor layer can be formed to serve as source and drain electrodes.

It is preferable that when the Fin-type channel transistor has a n type channel, the metal layer be formed of a rare earth metal or a silicide containing a rare earth metal, and when the Fin-type channel transistor has a p type channel, the metal layer be formed of a noble metal or a silicide containing a noble metal.

The second impurity regions can be halo regions of the first conductivity type.

The second impurity region can be an impurity region of the second conductivity type having substantially the same impurity concentration as the first impurity region. The gate electrode can be formed of a metal or a metal silicide.

A method of manufacturing a Fin-type channel transistor according to a second aspect of the present invention includes:

forming a Fin portion in a rectangular solid shape by patterning a semiconductor layer formed on a substrate;

forming a gate insulating film on a pair of first side portions of the Fin portion, the first side portions being opposed to each other;

forming a gate electrode at least on the first side portions of the Fin portion so that the gate insulating film is sandwiched between the gate electrode and the Fin portion; and depositing an insulating material on an entire surface, etching the insulating material and the Fin portion to expose a pair of second side portions of the Fin portion, the second side portions being opposed to each other and extending in a direction substantially perpendicular to the pair of first side portions of the Fin portion, the semiconductor layer being left at both sides of the gate electrode so as to connect to bottom portions of the second side portions.

The step of forming the Fin portion can include forming a first insulating layer on the semiconductor layer before the patterning of the semiconductor layer, and then patterning the first insulating layer and the semiconductor layer.

Steps of forming impurity regions in the second side portions exposed and the semiconductor layer left and performing silicidation of the impurity regions and the gate electrode can also be included.

A method of manufacturing a Fin-type channel transistor according to a third aspect of the present invention includes:

forming a first insulating layer on a semiconductor layer formed on a substrate;

forming a Fin portion in a rectangular solid shape by patterning the semiconductor layer;

forming a gate insulating film on a pair of first side portions of the semiconductor layer, the first side portions being opposed to each other;

forming a gate electrode material film on an entire surface, and then forming a second insulating layer on the gate electrode material film;

patterning the second insulating layer and the gate electrode material film to form a gate electrode covering the gate insulating film formed on the first side portions of the semiconductor layer and the first insulating layer on the semiconductor layer, the second insulating layer being left on the gate electrode;

depositing an insulating material on an entire surface, etching the insulating material and the Fin portion to expose a pair of second side portions of the semiconductor layer and to form gate sidewalls of the insulating material on the second insulating layer patterned and side portions of the gate electrode, the second side portions being opposed to each other and extending in a direction substantially perpendicular to the pair of first side portions of the semiconductor layer, and the semiconductor layer being left at both sides of the gate electrode so as to connect to bottom portions of the second side portions;

forming first impurity regions in the second side portions exposed and forming a second impurity region in the semiconductor layer left;

removing the second insulating layer sandwiched between the gate sidewalls to expose an upper surface of the gate electrode; and performing silicidation of the first and second impurity regions and the gate electrode.

The substrate can be an SOI substrate, and the semiconductor layer can be an SOI layer of the SOI substrate.

The substrate can also be a bulk substrate.

DESCRIPTION OF THE EMBODIMENTS

Hereinafter, embodiments of the present invention will be described with reference to the accompanying drawings.

First, the problems mentioned in the descriptions of the background art will be reviewed with reference to FIGS. 15A to 20C in order to clarify the characteristic features of a Fin-type channel transistor according to embodiments of the present invention.

When simplified, a process of manufacturing an ordinary Fin-type channel transistor can be illustrated as shown in FIGS. 15A to 20C. Although an example of an n-type channel device is shown here, a p-type channel device can also be manufactured in a similar manner.

Figure 15A:
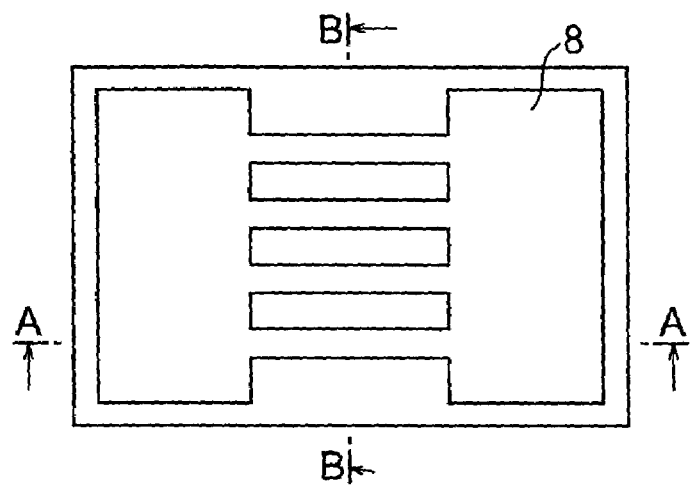
FIGS. 15A to 15C show a step of a process of manufacturing a conventional Fin-type channel transistor.
Figure 15B:
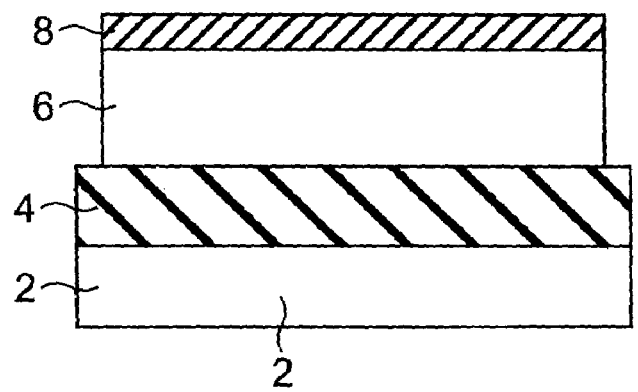
Figure 15C:
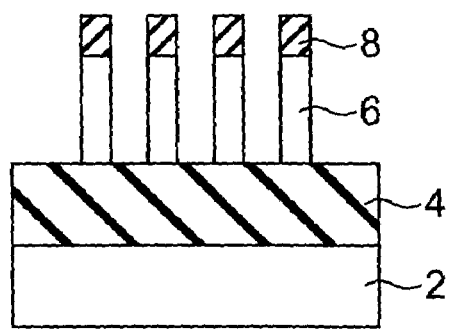

First, as shown in FIGS. 15A, 15B, and 15C, an SOI substrate is prepared by forming an insulating film 4 on a support substrate 2 and an SOI layer 6 on the insulating film 4. Thereafter, a silicon nitride layer 8 having a thickness of about 100 nm and serving as a protection layer of channels is deposited by LPCVD (Low Pressure Chemical Vapor Deposition) or the like, and device isolation is performed using a known device isolation technique. Subsequently, the SOI layer 6 is patterned using a known patterning technique, thereby forming Fins serving as channels. The width of each Fin is, for example, 10 nm.

Figure 16A:
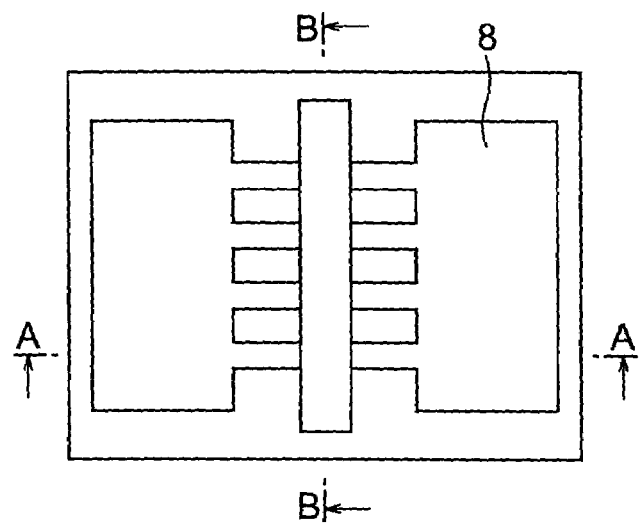
FIGS. 16A to 16C show a step of the process of manufacturing a conventional Fin-type channel transistor.
Figure 16B:
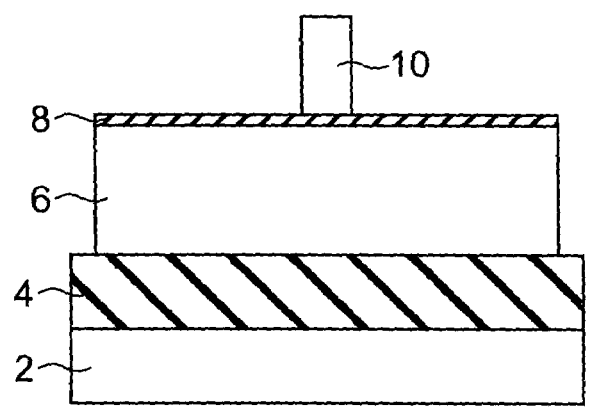
Figure 16C:
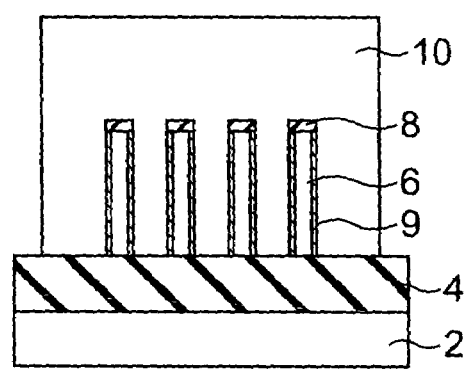

Next, as shown in FIGS. 16A, 16B, and 16C, a silicon dioxide layer serving as a gate insulating film 9 having a thickness of about 1 nm is formed by RTO (Rapid Thermal Oxidation) or the like, and then the dielectric constant thereof is increased by a plasma nitriding treatment. Thereafter, a polycrystalline silicon film serving as a gate electrode 10 is deposited to have a thickness of about 100 nm by LPCVD or the like, and a hard mask layer (not shown) of silicon nitride is deposited thereon. The hard mask layer is patterned using a photolithographic technique or the like. Subsequently, the polycrystalline silicon layer is patterned by RIE or the like using the patterned hard mask layer as a mask, thereby forming a gate electrode 10 (FIGS. 16A, 16B, and 16C). It is possible to form an offset spacer etc. (not shown in the drawings) at the same time.

Figure 17A:
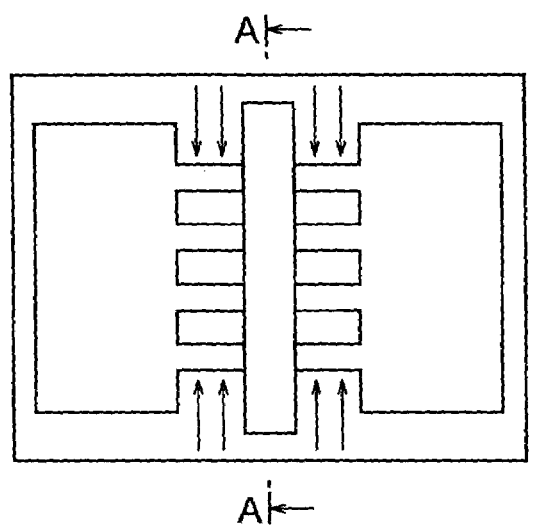
FIGS. 17A to 17C show a step of the process of manufacturing a conventional Fin-type channel transistor.
Figure 17B:
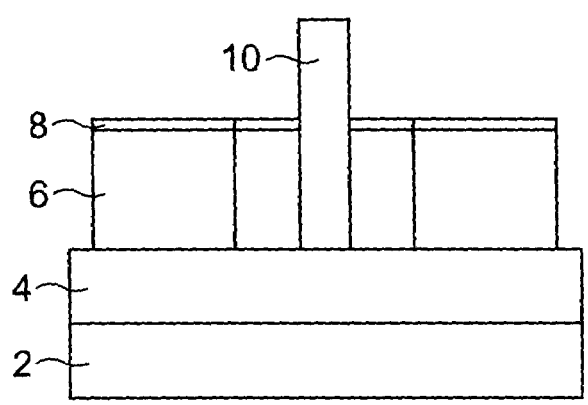
Figure 17C:
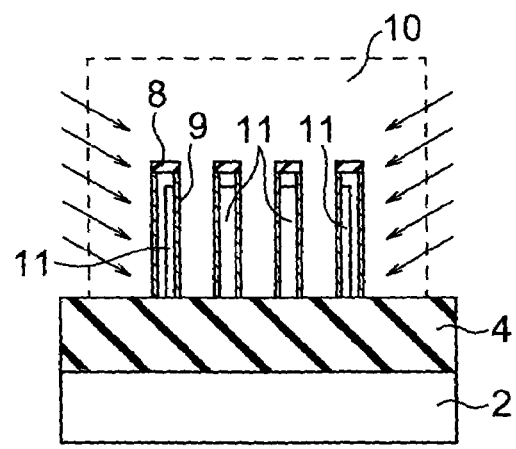

Thereafter, as shown in FIGS. 17A, 17B, and 17C, about $1 \times 10^{14}$ cm$^{-2}$ of boron ions are implanted at 1 keV, thereby forming a halo region, and then about $2 \times 10^{15}$ cm$^{-2}$ of arsenic ions are implanted at 0.5 keV, thereby forming an extension region. At this time, there are regions 11 where no ion is implanted due to the existence of adjacent Fins as shown in FIG. 17C. FIG. 17A is a plan view, FIG. 17B is a front view, and FIG. 17C is a sectional view taken along line A-A of FIG. 17A.

Figure 18A:
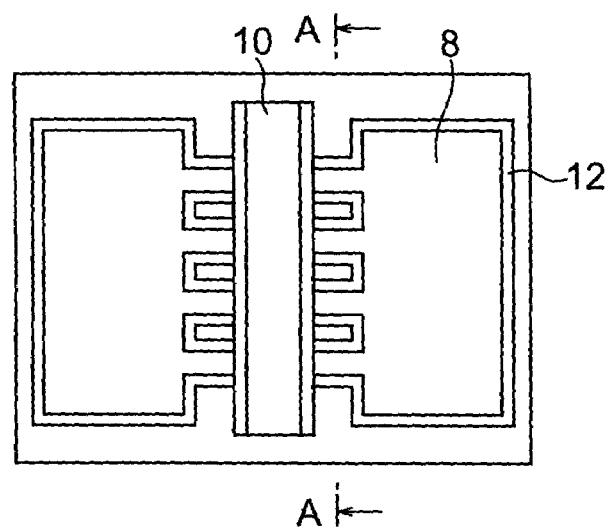
FIGS. 18A to 18C show a step of the process of manufacturing a conventional Fin-type channel transistor.
Figure 18B:
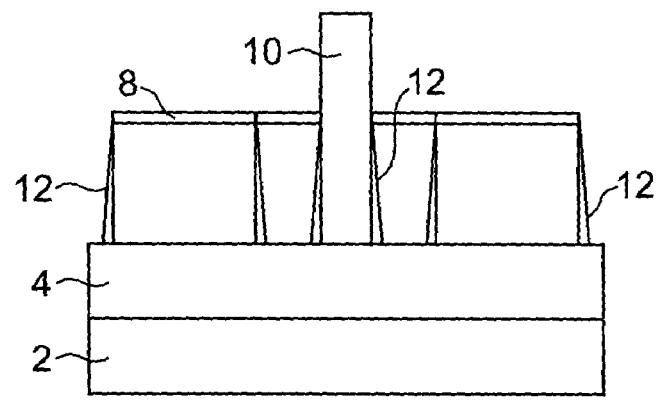
Figure 18C:
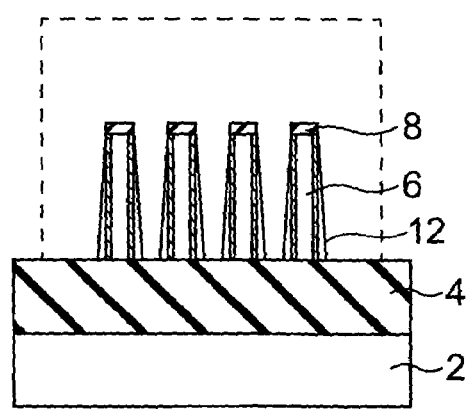

Subsequently, as shown in FIGS. 18A, 18B, and 18C, a stacked layer including a silicon dioxide layer having a thickness of 10 nm and a silicon nitride layer having a thickness of 10 nm is deposited by LPCVD, and patterned by RIE (Reactive Ion Etching) or the like, thereby forming a gate sidewall 12. FIG. 18A is a plan view, FIG. 18B is a front view, and FIG. 18C is a sectional view taken along line A-A of FIG. 18A.

Figure 19A:
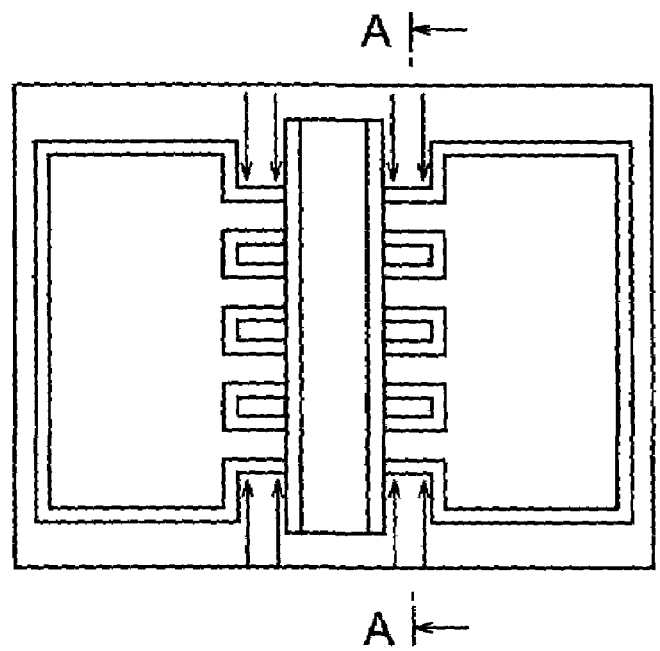
FIGS. 19A and 19B show a step of the process of manufacturing a conventional Fin-type channel transistor.
Figure 19B:
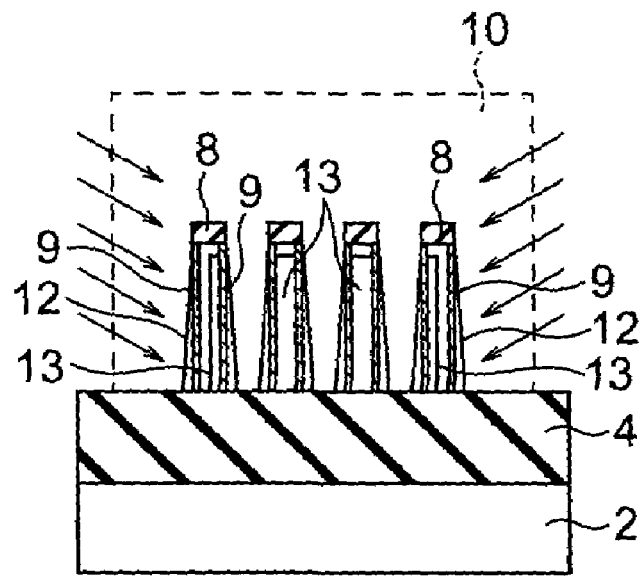

Next, as shown in FIGS. 19A and 19B, about $3 \times 10^{15}$ cm$^{-2}$ of arsenic ions are implanted at 30 keV, thereby forming a deep diffusion layer region 16. At this time, there are regions 13 where no ion is implanted due to the existence of adjacent Fins as shown in FIG. 19B.

Figure 20A:
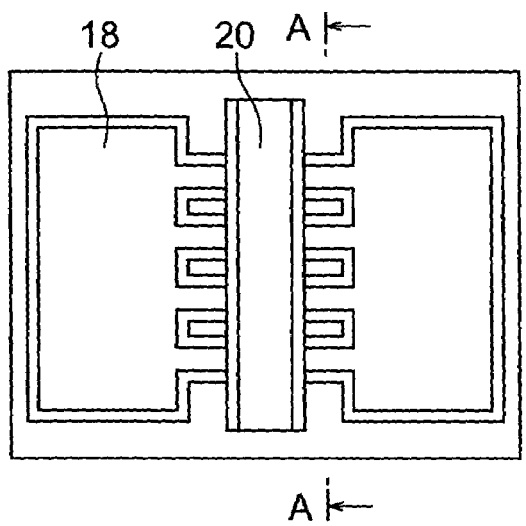
FIGS. 20A to 20C show a step of the process of manufacturing a conventional Fin-type channel transistor.
Figure 20B:
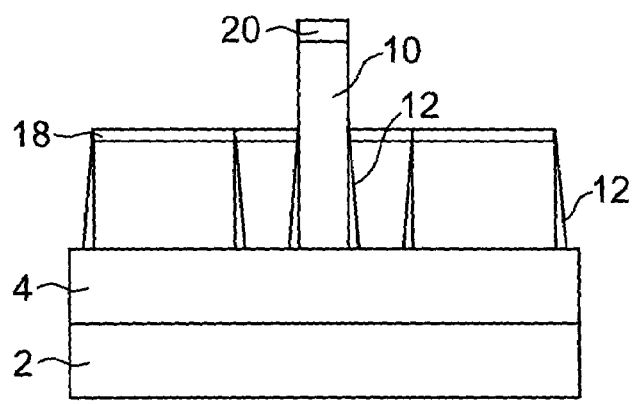
Figure 20C:
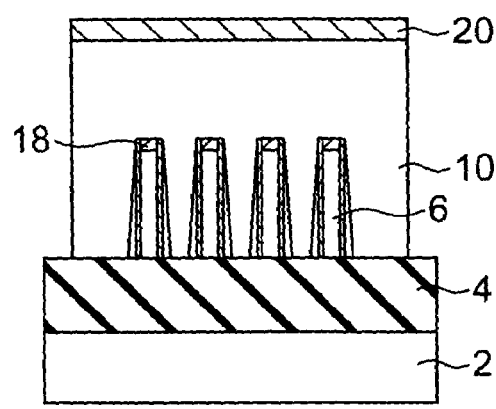

Thereafter, a hot phosphoric acid treatment is performed to remove the protection layer 8 on the fin region 6. Then, sputtering of Co or Ni and a heat treatment are performed, thereby forming self-aligned silicide layers 18 and 20 on the fin region 6 and the gate electrode 10 (FIGS. 20A, 20B, and 20C). FIG. 20A is a plan view, FIG. 20B is a front view, and FIG. 20C is a sectional view taken along line A-A of FIG. 20A. Subsequently, a contact forming step etc. is performed.

The first problem mentioned in the descriptions of the background art is that in a case where the height of Fins is high relative to the interval between Fins, ion implantation from the sides and top becomes difficult due to the existence of adjacent Fins, as shown in FIGS. 17A, 17B, 17C, 19A, and 19B.

The second problem is that there is a case where no silicides is formed at the source and drain regions located at the lower portions of the Fins due to the insulating film etc. remaining on the gate sidewalls, as shown in FIGS. 20A, 20B, and 20C. This may happen not only when there are a plurality of Fins, but also when there is only one Fin.

First Embodiment

Next, the structure of a Fin-type channel transistor according to a first embodiment of the present invention will be described with reference to FIGS. 1A to 7. Although an n-type channel device will be described as an example of a Fin-type channel transistor according to this embodiment, a p-type channel device can also be manufactured in a similar manner by changing the kind of ion species implanted.

Figure 1A:
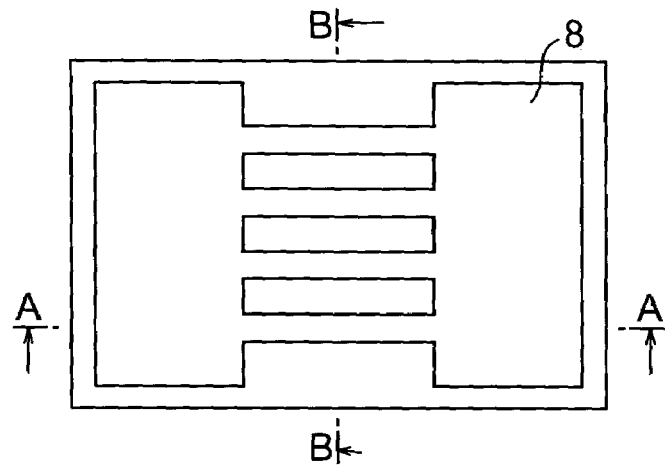
FIGS. 1A to 1C show a step of a process of manufacturing a Fin-type channel transistor according to a first embodiment of the present invention.
Figure 1B:
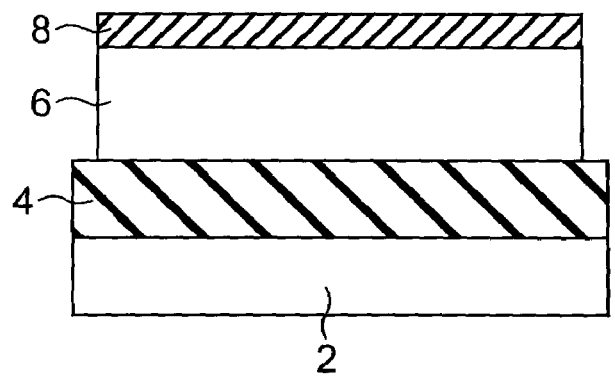
Figure 1C:
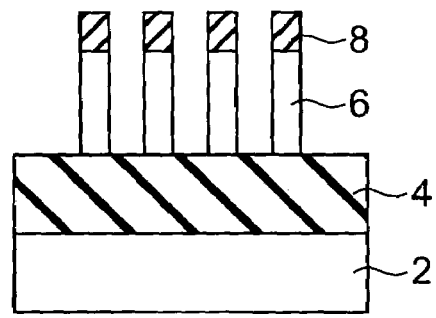

First, as shown in FIGS. 1A, 1B, and 1C, an SOI substrate is prepared by forming an insulating film 4 on a support substrate 2 and an SOI layer 6 on the insulating film 4. Thereafter, a silicon nitride layer 8 having a thickness of about 100 nm and serving as a protection layer of channels is deposited by LPCVD (Low Pressure Chemical Vapor Deposition) or the like, and device isolation is performed using a known device isolation technique. Subsequently, the SOI layer 6 is patterned using a known patterning technique, thereby forming Fins serving as channels. The width of each Fin is, for example, 10 nm. FIG. 1A is a plan view, FIG. 1B is a sectional view taken along line A-A of FIG. 1A, and FIG. 1C is a sectional view taken along line B-B of FIG. 1A.

Figure 2A:
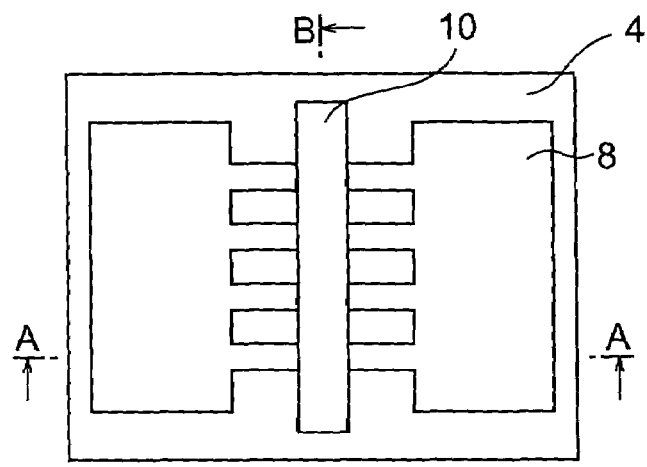
FIGS. 2A to 2C show a step of the process of manufacturing a Fin-type channel transistor according to the first embodiment of the present invention.
Figure 2B:
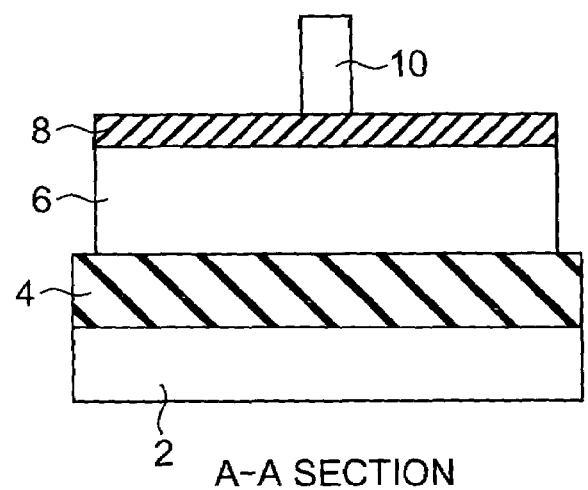
Figure 2C:
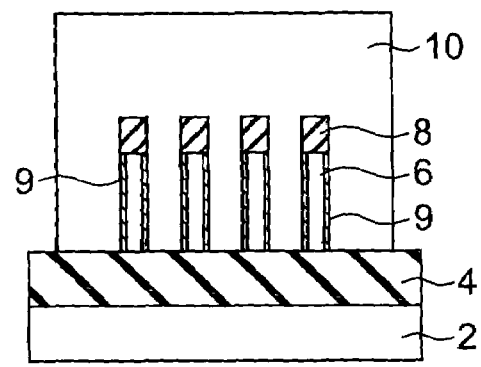

Thereafter, as shown in FIGS. 2A, 2B, and 2C, a silicon dioxide layer serving as a gate insulating film 9 having a thickness of about 1 nm is formed by RTO (Rapid Thermal Oxidation) or the like, and then the dielectric constant thereof is increased by a plasma nitriding treatment. Thereafter, a polycrystalline silicon film serving as a gate electrode 10 is deposited to have a thickness of about 100 nm by LPCVD or the like, and a hard mask layer (not shown) of silicon nitride is deposited thereon. The hard mask layer is patterned using a photolithographic technique or the like. Subsequently, the polycrystalline silicon layer is patterned by RIE or the like using the patterned hard mask layer as a mask, thereby forming a gate electrode 10 (FIGS. 2A, 2B, and 2C). It is possible to also form an offset spacer etc. (not shown in the drawings) at the same time. FIG. 2A is a plan view, FIG. 2B is a sectional view taken along line A-A of FIG. 2A, and FIG. 2C is a sectional view taken along line B-B of FIG. 2A.

Figure 3:
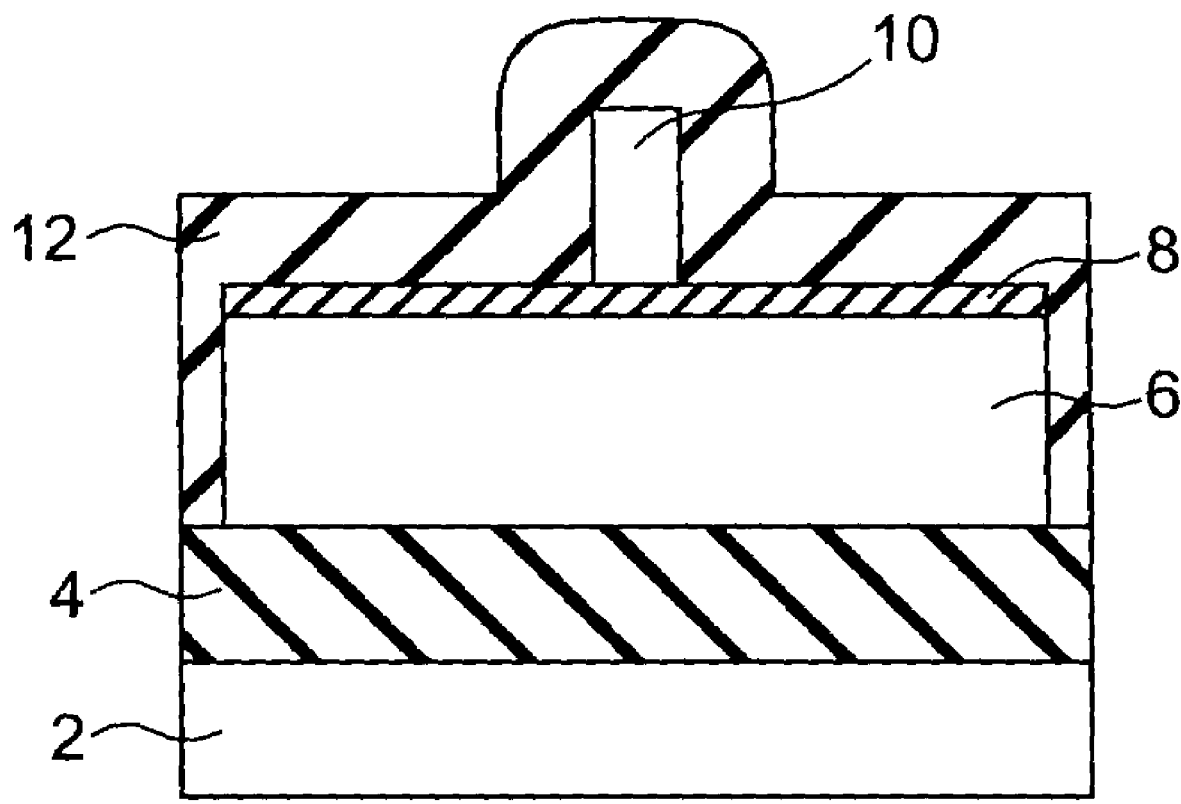
FIG. 3 is a sectional view showing a step of the process of manufacturing a Fin-type channel transistor according to the first embodiment of the present invention.
Figure 4A:
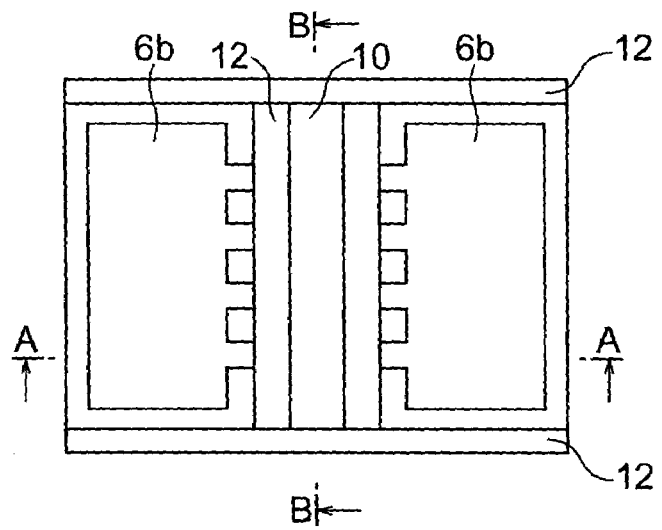
FIGS. 4A to 4C show a step of the process of manufacturing a Fin-type channel transistor according to the first embodiment of the present invention.
Figure 4B:
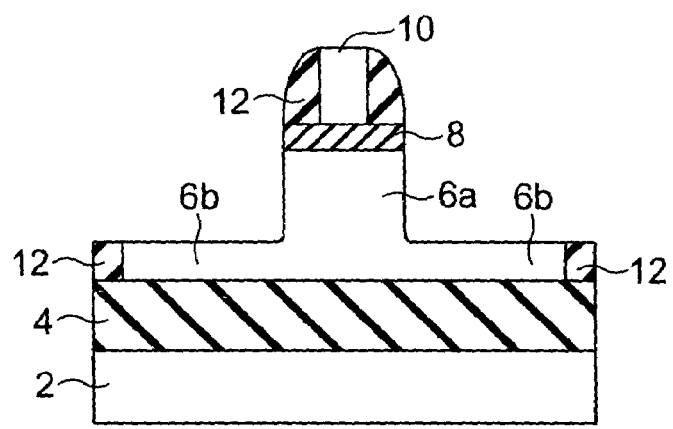
Figure 4C:
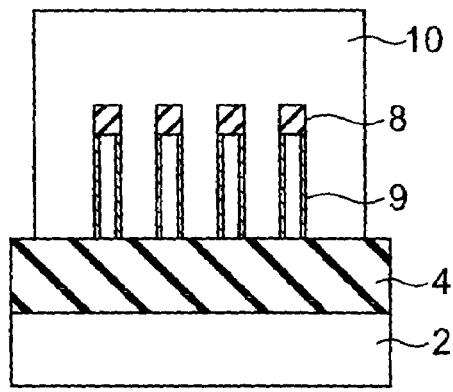

Subsequently, as shown in FIG. 3, a stacked layer including a silicon dioxide layer having a thickness of 10 nm and a silicon nitride layer having a thickness of 10 nm is deposited by LPCVD. Then, anisotropy etching such as RIE (Reactive Ion Etching) is performed to form a gate sidewall 12 and Fins 6 serving as channels at the same time (FIGS. 4A, 4B, and 4C). In this patterning step, side portions the Fins 6a, which are in parallel with the gate electrode 10 and perpendicular to the channel direction, are exposed, as shown in FIGS. 4A, 4B, and 4C. In FIGS. 4A and 4B, the reference numeral 6b denotes a semiconductor region which is connected to bottom portions of a plurality of channel Fins 6a to serve as part of source and drain regions. The exposure of the side portions of the channel Fins 6a, which are in parallel to the gate 10 and perpendicular to the channel direction, is a remarkable characteristic feature of this embodiment that distinguishes this embodiment from the background art. FIG. 3 is a sectional view corresponding to FIG. 2B, FIG. 4A is a plan view, FIG. 4B is a sectional view taken along line A-A of FIG. 4A, and FIG. 4C is a sectional view taken along line B-B of FIG. 4A.

Figure 5A:
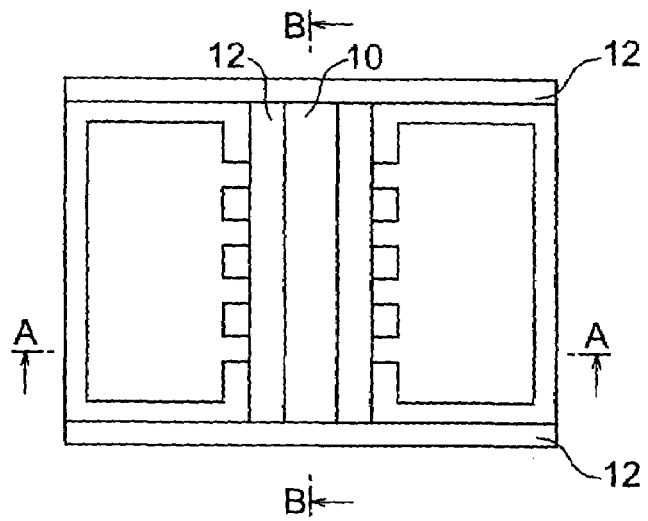
FIGS. 5A to 5C show a step of the process of manufacturing a Fin-type channel transistor according to the first embodiment of the present invention.
Figure 5B:
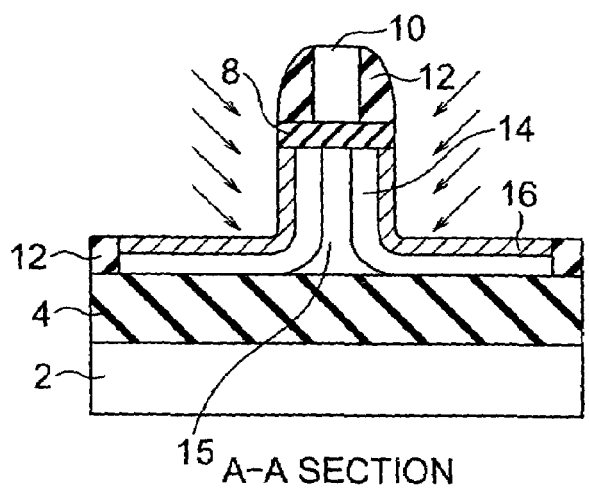
Figure 5C:
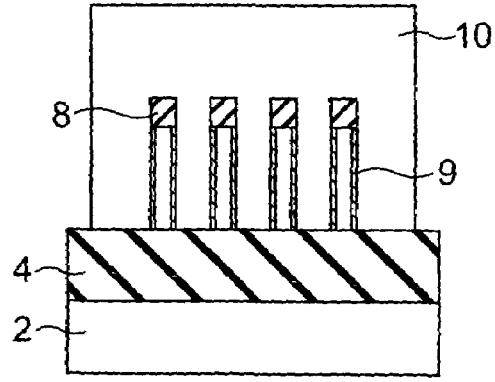

Next, as shown in FIGS. 5A, 5B, and 5C, about $1\times10^{14}$ $cm^{-2}$ of boron ions are implanted at 1 keV, thereby forming a halo region, and then about $2\times10^{15}$ $cm^{-2}$ of arsenic ions are implanted at 0.5 keV, thereby forming an extension region to form a pair of impurity regions 14 serving as part of source and drain regions. Then about $3\times10^{15}$ $cm^{-2}$ of arsenic ions are implanted at 30 keV, thereby forming a deep diffusion layer region 16. The semiconductor layer 6a between the impurity regions 14 serves as a channel region 15. FIG. 5A is a plan view, FIG. 5B is a sectional view taken along line A-A of FIG. 5A, and FIG. 5C is a sectional view taken along line B-B of FIG. 5A.

Figure 6A:
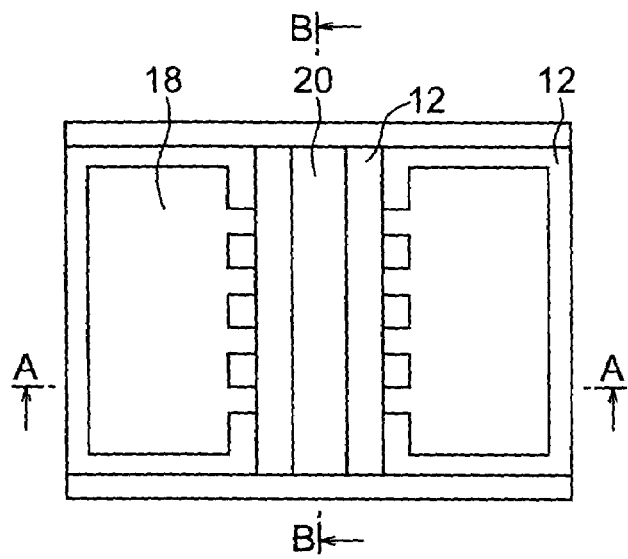
FIGS. 6A to 6C show a step of the process of manufacturing a Fin-type channel transistor according to the first embodiment of the present invention.
Figure 6B:
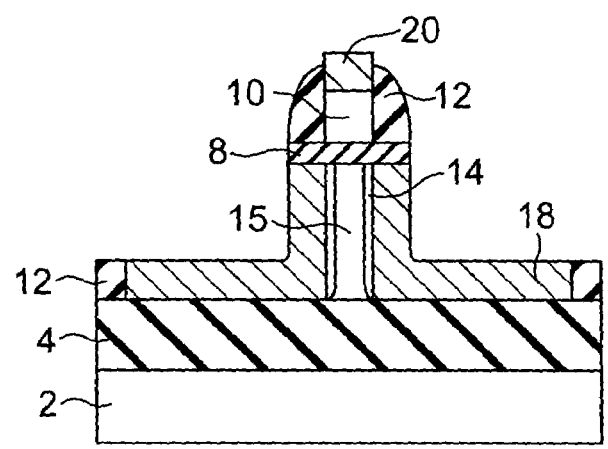
Figure 6C:
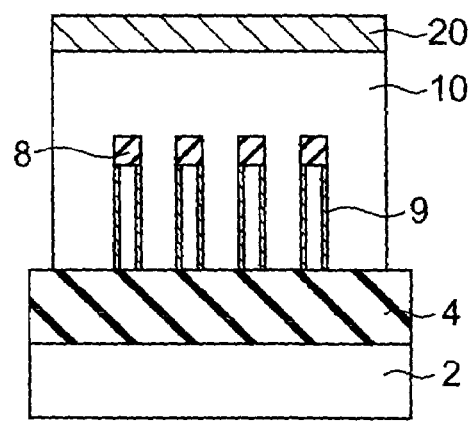
Figure 7:
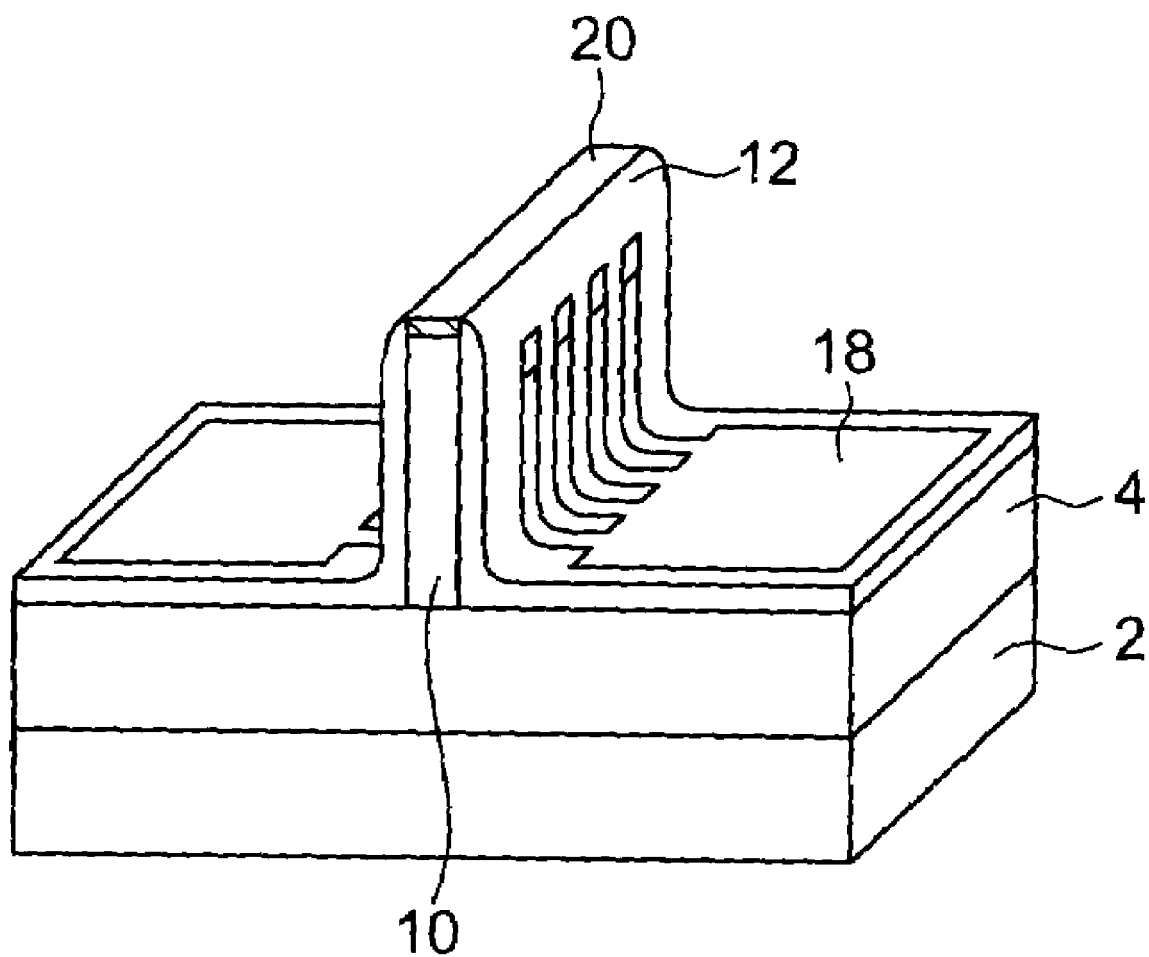
FIG. 7 is a perspective view showing a step of the process of manufacturing a Fin-type channel transistor according to the first embodiment of the present invention.

Subsequently, a high melting point metal such as Co or Ni is sputtered, and heat treated, thereby forming a self-aligned silicide layer 18 on the Fin regions 6a and 6b, and a self-aligned silicide layer 20 on the gate electrode 10 (FIGS. 6A, 6B, and 6C). As can be understood from FIG. 6B, the entire portions of the deep diffusion layer 16 serving as source and drain regions are changed to the silicide layer 18. However, only a part thereof can be changed to silicide. In the present invention, the impurity regions 14, the deep diffusion layer 16 and the silicide layer 18 altogether are called "source and drain regions." FIG. 7 shows a perspective view of the Fin-type channel transistor according to this embodiment at this time. FIG. 6A is a plan view, FIG. 6B is a sectional view taken along line A-A of FIG. 6A, and FIG. 6C is a sectional view taken along line B-B of FIG. 6A.

In the aforementioned manner, a basic structure of a Fin-type transistor according to this embodiment is completed.

Although an activation annealing step etc. is optionally performed after each ion implantation step, descriptions of such a step are omitted.

Although the halo region should not necessarily be formed, it is desirable to form it in order to curb the short channel effect.

In this embodiment, it is preferable that the film thickness of the gate sidewall 12 be equal to or thinner than that of the SOI layer 6.

In a Fin-type transistor according to this embodiment thus constituted, a plurality of the semiconductor layers 6a in a substantially rectangular solid shape serving as channel Fins are arranged in parallel with each other on a substrate at predetermined intervals. A gate electrode 10 is provided so as to contact both sides of the semiconductor layers 6a arranged in parallel via a gate insulating film 9. A portion of the gate electrode 10 between adjacent semiconductor layers 6a serves as a common gate electrode of the adjacent semiconductor layers 6a. These portions of the gate electrodes 10 are commonly connected. The bottom portion of each semiconductor layer 6a has an extending portion 6b extending in a direction substantially perpendicular to the direction along which the channel Fins are arranged. The extending portion 6b extending in a direction substantially perpendicular to the direction along which the channel Fins are arranged becomes a deep diffusion layer region 16 after being subjected to ion implantation. In this embodiment, the deep diffusion layer regions 16 are commonly connected. A halo region and a pair of impurity regions 14 serving as the extension regions are formed in opposite planes of each semiconductor layer 6a in a direction substantially perpendicular to the direction along which the channel Fins are arranged. A portion of the semiconductor layer 6a between the pair of impurity regions 14 serves as a channel region 15. In this embodiment, the entire portions of the source and drain regions 16 become the silicide layer 18, and only the surface of the impurity regions 14 becomes the silicide layer 18.

Thus, in this embodiment, the impurity regions 14 and 16 are formed in each Fin 6a, 6b, and a silicide is made on the surface thereof. Accordingly, it is possible to reliably implant an impurity into an impurity forming region, and to form self-aligned silicide on the entire portions of the source and drain regions. Accordingly, it is possible to have a uniform impurity profile in a substrate depth direction of a Fin-type channel transistor, thereby considerably decreasing the parasitic resistance.

Second Embodiment

Figure 8A:
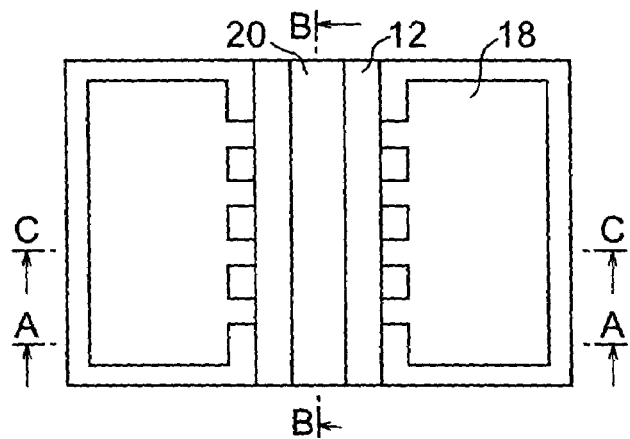
FIGS. 8A to 8C show a structure of a Fin-type channel transistor according to a second embodiment of the present invention.
Figure 8B:
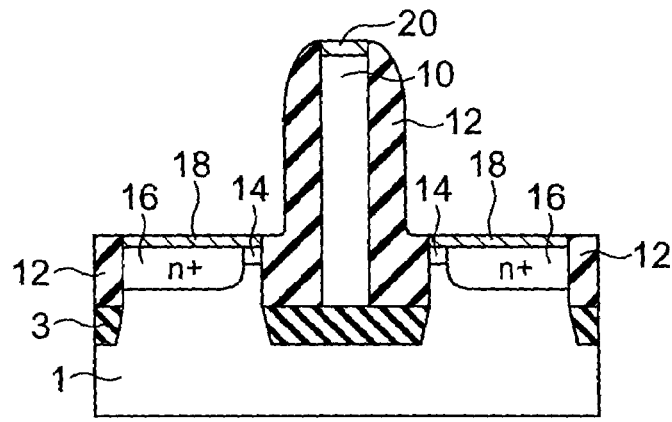
Figure 8C:
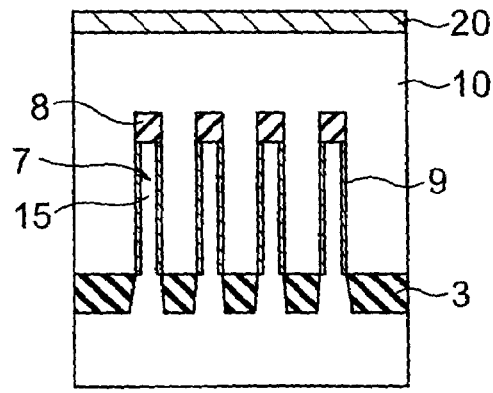
Figure 9:
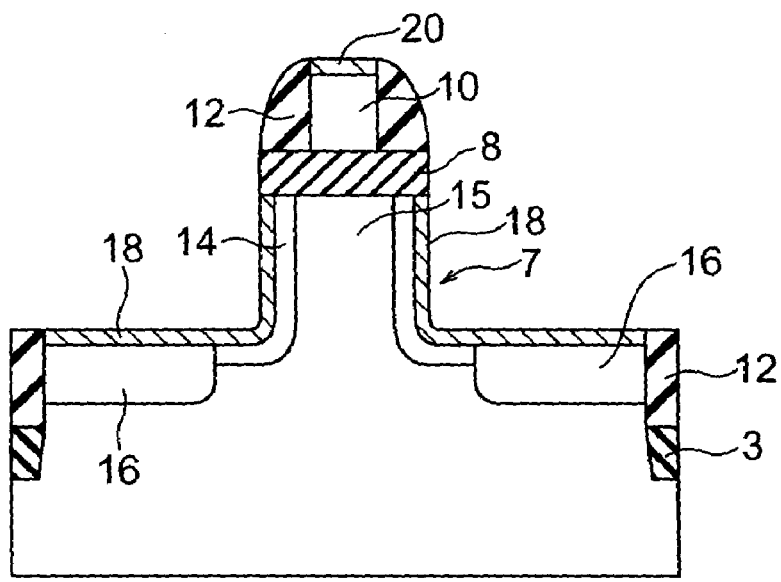
FIG. 9 is a sectional view showing the structure of a Fin-type channel transistor according to a second embodiment of the present invention.
Figure 10:
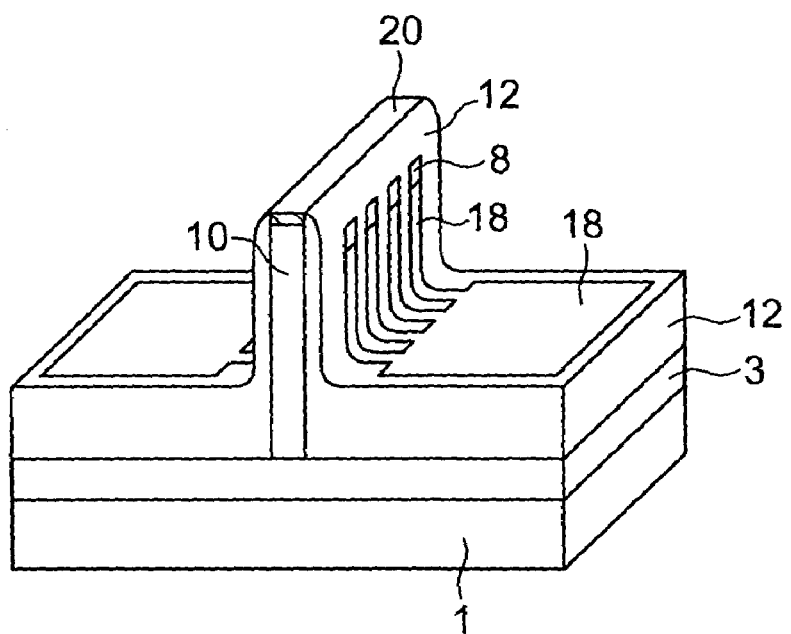
FIG. 10 is a perspective view showing the structure of the Fin-type channel transistor according to the second embodiment of the present invention.

Next, FIGS. 8A to 10 show a structure of a Fin-type channel transistor according to a second embodiment of the present invention. FIG. 8A is a plan view of a Fin-type channel transistor according to this embodiment, FIG. 8B is a sectional view taken along line A-A of FIG. 8A, FIG. 8C is a sectional view taken along ling B-B of FIG. 8A, FIG. 9 is a sectional view taken along line C-C of FIG. 8A, and FIG. 10 is a perspective view of a Fin-type channel transistor according to this embodiment.

The Fin-type channel transistor according to this embodiment is formed on a bulk substrate, which differentiates the Fin-type channel transistor of this embodiment from the Fin-type channel transistor of the first embodiment formed on an SOI substrate. Although an n-type channel device will be described as an example of a Fin-type channel transistor of this embodiment, a p-type channel device can be manufactured in a similar manner.

A plurality of semiconductor layers 7 serving as channel Fins are arranged in a line at predetermined intervals on a bulk silicon substrate 1, which is element isolated by STI (Shallow Trench Isolation) 3. A gate electrode 10 is provided so as to contact both sides of the semiconductor layers 7 arranged in a line via a gate insulating film 9. A portion of the gate electrode 10 between adjacent semiconductor layers 7 serves as a common gate electrode of the adjacent semiconductor layers 7. These portions of the gate electrodes 10 are commonly connected. The bottom portion of each semiconductor layer 7 is connected to the substrate 1. The upper surface of each semiconductor layer 7 is covered by a channel protection hark mask. Deep diffusion layer regions 16 are formed at both sides of each semiconductor layer 7 in the substrate 1 in a direction substantially perpendicular to the direction of the channel Fins arranged in parallel. In this embodiment, the deep diffusion layer regions 16 are commonly connected. A halo region and a pair of impurity regions 14 serving as extension regions are formed in opposite planes of each semiconductor layer 7 in a direction substantially perpendicular to the direction along which the channel Fins are arranged. A portion of the semiconductor layer 7 between the pair of impurity regions 14 serves as a channel region 15. In this embodiment, only the surface of the source and drain regions becomes the silicide layer 18. Except for the Fin portions and the top surface, the surfaces of the gate electrode 10 are covered by the sidewall 12. A silicide layer 20 is formed in a self aligning manner on the gate electrode 10. The bottom portion of the gate electrode 10 contacts the STI layer 3.

Thus, in this embodiment, the impurity regions 14 are formed at side portions of each semiconductor layer 7, and deep diffusion layer regions 16 are formed in the surface region of the substrate 1, the surface of the deep diffusion layer region 16 being silicided. Accordingly, it is possible to reliably implant an impurity into an impurity forming region, and to form a self-aligned silicide on the entire portions of the source and drain regions. Accordingly, it is possible to have a uniform impurity profile in a substrate depth direction of a Fin-type channel transistor, thereby considerably decreasing the parasitic resistance.

Since a bulk substrate, which is cheaper than an SOI substrate, can be used in this embodiment, it is possible to have such advantages as the alleviation of the depth accuracy when a gate electrode and a channel are processed.

This embodiment can be seen as a transistor having a plurality of channels having a double gate structure, which are arranged in a perpendicular direction on a portion extending from the substrate 1. Because a bulk substrate is used, the bottom portion of the deep diffusion layer region 16 tends to serve as a path for a punch-through current. It is possible to curb the punch-through current by a gate electric field in this embodiment. Specifically, the bottom portion of the gate electrode 10 is located lower than the bottom portion of the deep diffusion layer region 16.

Figure 21:
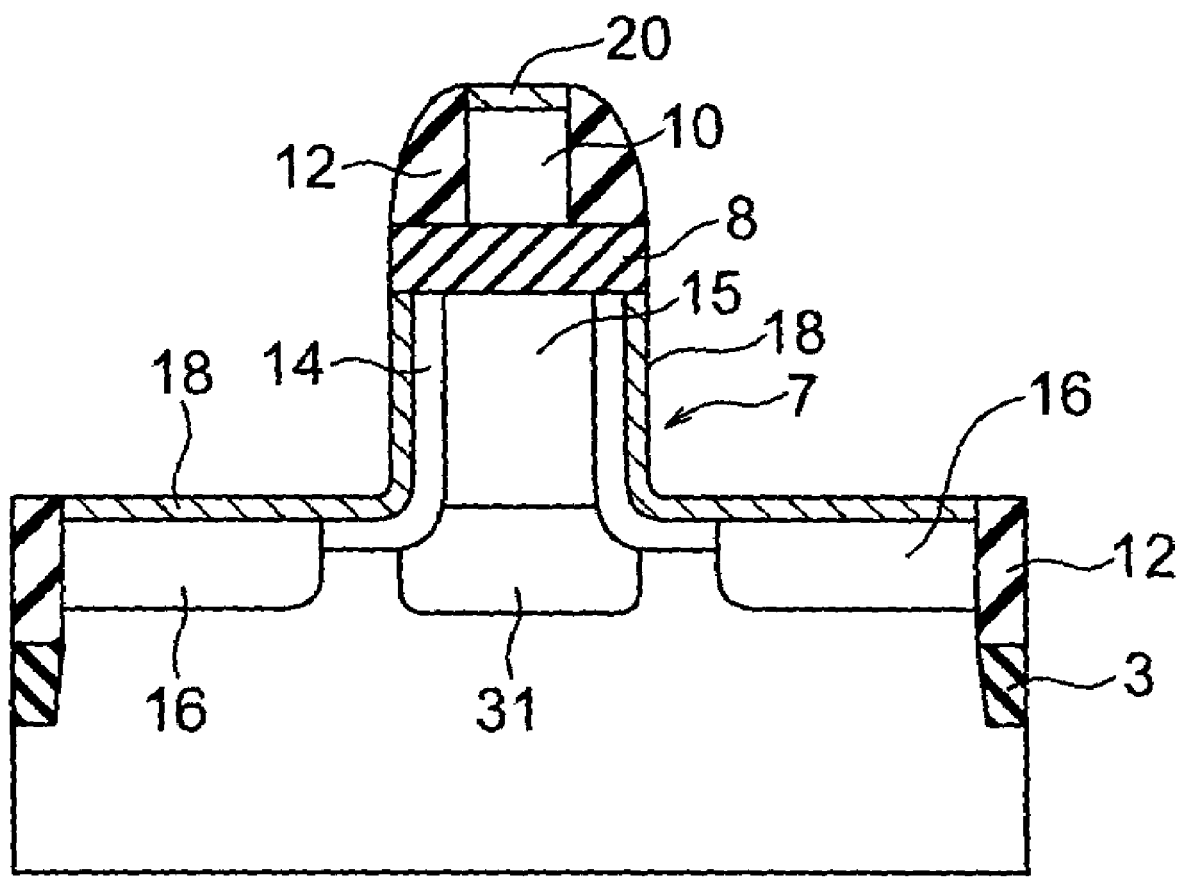
FIG. 21 is a sectional view showing a structure of a Fin-type channel transistor according to a modification of the second embodiment.

In this embodiment, it is advisable to form an impurity region 31 at the bottom portion of a Fin serving as a channel as shown in FIG. 21, the impurity region 31 having a conductivity type opposite to that of the deep diffusion layer regions 16 serving as the source and drain regions. In this manner, it is possible to effectively curb the aforementioned punch-through current.

Next, the most preferable structure of the second embodiment will be described below.

In the second embodiment, it is preferable that the distance from the deep diffusion layer region 16 to the edge of the gate electrode 10 be equal to or longer than the distance from the silicide layer 18 to the edge of the gate electrode 10, and it is also preferable that the depth thereof be equal to or deeper than that of the pair of impurity regions 14 and equal to or shallower than the lower edge of the gate electrode 10. In this manner, it is possible to curb the leakage current at a minimum level. Although the halo region should not necessarily be formed, it is preferable to form it in order to curb the short channel effect.

Third Embodiment

Figure 11:
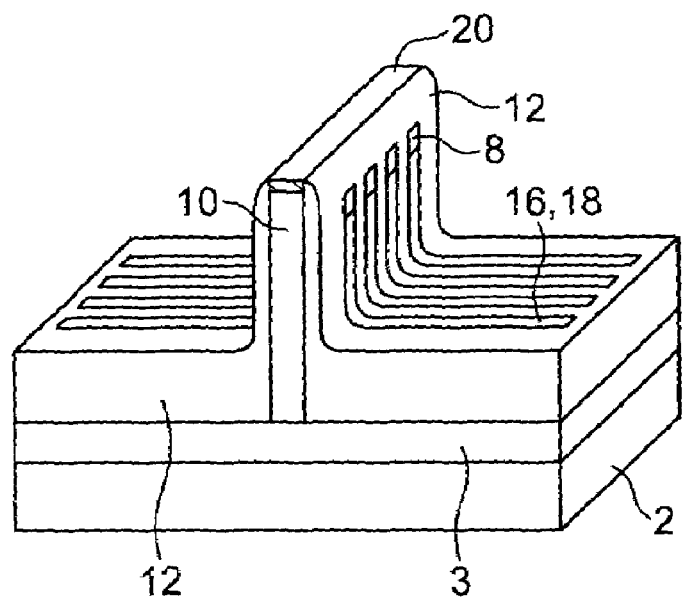
FIG. 11 is a perspective view of a Fin-type channel transistor according to a third embodiment of the present invention before an elevated source and drain layer is formed.

Next, the structure of a Fin-type channel transistor according to a third embodiment of the present invention will be described with reference to FIGS. 11 and 12.

Figure 12:
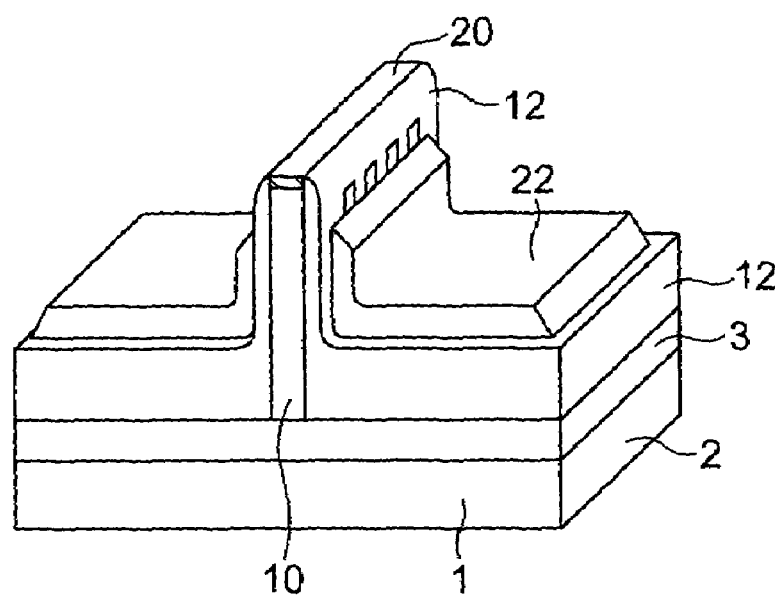
FIG. 12 is a perspective view showing a structure of the Fin-type channel transistor according to the third embodiment of the present invention.

The Fin-type channel transistor of this embodiment is formed on a bulk silicon substrate, and includes an elevated source and drain layer 22 (FIG. 12). With such an elevated source and drain layer 22, the bottom area of the source and drain regions 16 can be decreased, thereby further decreasing the leakage current. Specifically, as shown in FIG. 11, the structure of this embodiment is similar to that of the second embodiment except for the existence of the source and drain regions 16 and the strip shape of the source and drain regions. After the state of FIG. 11, silicon epitaxial growth is performed to selectively cover the silicon-exposed portions 18 with the elevated silicon layer 22, as shown in FIG. 12. In FIG. 12, the elevated silicon layer 22 grows not only on the silicon-exposed portions 18 but also in a horizontal direction (direction along which semiconductor layers serving as Fins are arranged in parallel) to integrally cover the silicon-exposed portions 18. After this state, ions are implanted into the silicon layer 22 to form the source and drain regions, and the silicidation thereof is performed. The last epitaxial growth should not necessarily be performed, but with this step, it is possible to increase the contact area and to decrease the contact resistance.

As in the case of the second embodiment, in this embodiment, it is possible to reliably implant an impurity into an impurity forming region, and to form a self-aligned silicide on the entire portions of the source and drain regions. Accordingly, it is possible to make a uniform impurity profile in a depth direction of the Fin-type channel transistor substrate, thereby considerably decreasing the parasitic resistance.

Figure 22:
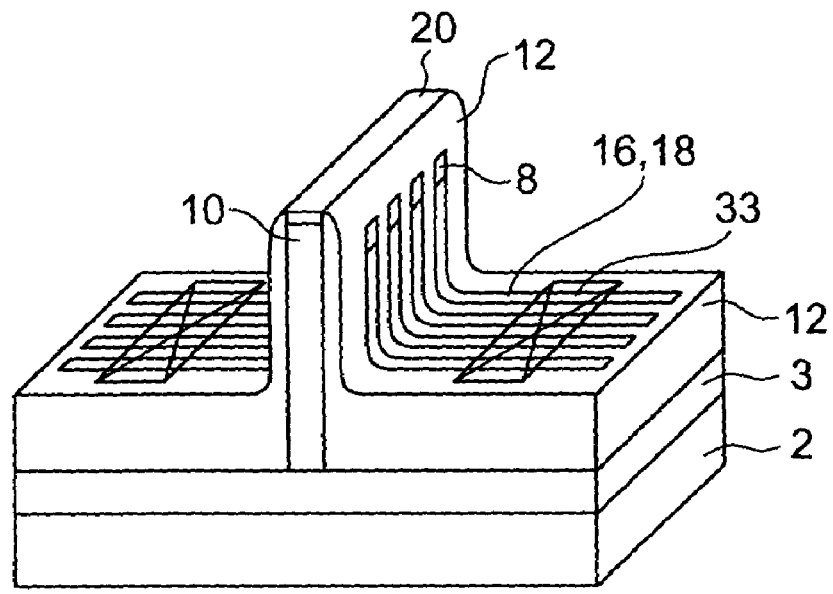
FIG. 22 is a perspective view showing a structure of a Fin-type channel transistor according to a first modification of the third embodiment.
Figure 23:
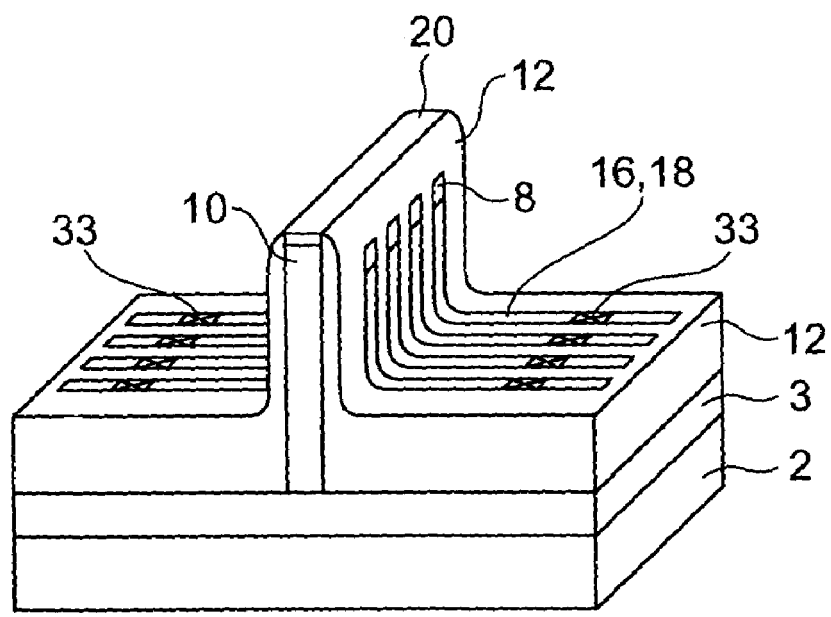
FIG. 23 is a perspective view showing a structure of a Fin-type channel transistor according to a second modification of the third embodiment.

When a known lithography technique is used, it is difficult to form a pattern having narrow portions and wide portions. In other words, it is easier to form a simple line-and-space structure shown in FIG. 11 than to form a Fin structure shown in FIG. 10. Accordingly, if this is a problem, after the structure shown in FIG. 11 is formed, a contact or contacts 33 can be directly formed as shown in FIG. 22 or FIG. 23.

Although silicon is used to form the elevated source and drain layer 22 in this embodiment, other materials such as silicon germanium can also be used. An epitaxial layer of silicon germanium gives an advantage of, for example, adding strain stress to the channel portion of the p-channel device to improve the mobility, thereby providing a greatest parasitic resistance decreasing effect.

Fourth Embodiment

Next, a structure of a Fin-type channel transistor according to a fourth embodiment of the present invention will be described with reference to FIG. 13.

Figure 13:
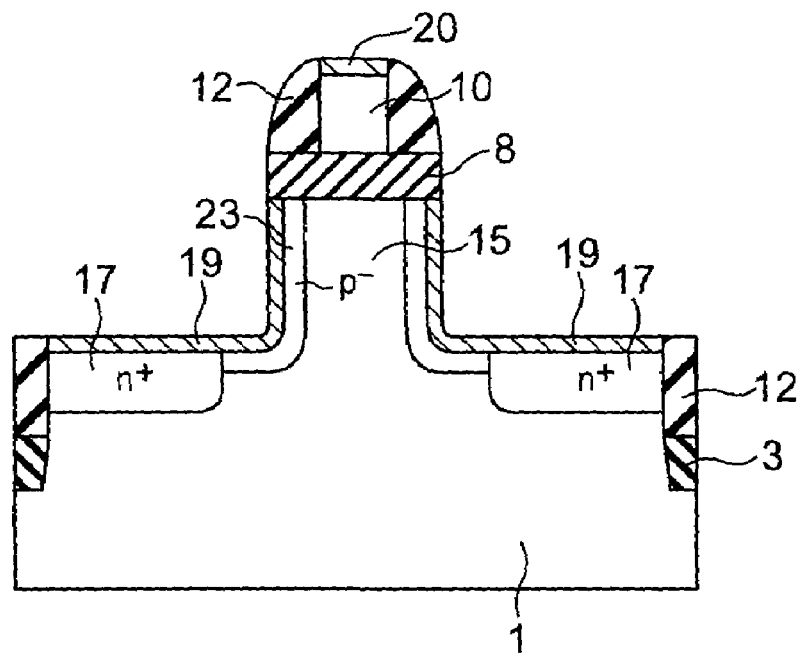
FIG. 13 is a sectional view showing a structure of a Fin-type channel transistor according to a fourth embodiment of the present invention.

Although the diffusion layer source and drain structure is employed in the first to third embodiments, a Fin-type channel transistor of this embodiment has a structure in which the diffusion layer source and drain of the second embodiment are replaced with a Schottky junction source/drain metal layer 19 and an $n^+$ diffusion layer 17 for preventing the leakage is provided, as shown in FIG. 13. As a result, the impurity regions 14 are replaced with $p^-$ halo regions 23. FIG. 13 is a sectional view corresponding to the sectional view shown in FIG. 9.

Since this embodiment is an n-type channel device, a desirable material to form the metal layer 19 is, for example, a rare earth metal such as erbium (Er) or a silicide containing a rare earth metal. The reason for this is that the height of Schottky barrier of a rare earth metal such as erbium (Er) with respect to an electron is relatively low. As a result, the source-drain resistance becomes lower. When a p-type channel device is manufactured, a noble metal such as, for example, platinum (Pt) or a silicide containing a noble metal can be used. The reason for this is that the height of the Schottky barrier of a noble metal silicide with respect to a hole is relatively low.

The entire portion of the gate electrode 10 can be formed of a silicide containing a rare earth metal which is the same as the material of the source and drain regions. In this manner, the work function of the gate electrode becomes substantially the same level as that of the polycrystalline silicon, which is widely employed to form gate electrodes at present. As a result, it is not necessary to considerably change the circuit design.

Although an example of using a bulk substrate is described in this embodiment, a device formed on an SOI substrate has a similar effect as in the case of the first embodiment.

As in the case of the second embodiment, in this embodiment, it is possible to reliably implant an impurity into an impurity forming region, and to form a self-aligned silicide on the entire portions of the source and drain regions. Accordingly, it is possible to have a uniform impurity profile in a substrate depth direction of a Fin-type channel transistor, thereby considerably decreasing the parasitic resistance.

Fifth Embodiment

Figure 14:
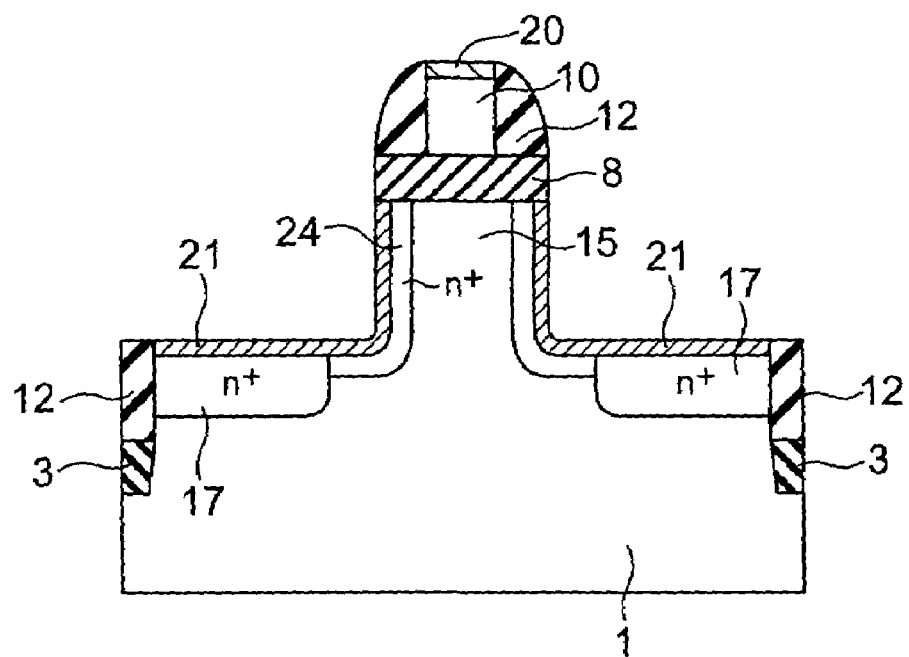
FIG. 14 is a sectional view showing a structure of a Fin-type channel transistor according to a fifth embodiment of the present invention.

Next, a Fin-type channel transistor according to a fifth embodiment of the present invention will be described with reference to FIG. 14.

The Fin-type channel transistor of this embodiment can be obtained by combining the Fin-type channel transistor of the fourth embodiment with another kind of Schottky source and drain. This embodiment differs from the fourth embodiment in that a high-concentration impurity layer 24, which has a higher impurity concentration and a thinner thickness, is provided around the metal source and drain 21. The high-concentration impurity layer 24 contains, for example, phosphorous (P), arsenic (As) or boron (B) as an impurity. In a desirable state of this embodiment, an impurity concentration of the high-concentration impurity layer 24 is about $1 \times 10^{20}$ $cm^{-3}$ or more, and the thickness thereof is about 10 nm or less. Alternatively, the impurity concentration of the high-concentration impurity layer 24 is $1 \times 10^{20}$ $cm^{-3}$ or more and the film thickness of the gate sidewall 12 is about 10 nm or less. The other portions of this embodiment can be the same as those of the fourth embodiment, but a mid-gap metal such as cobalt silicide and nickel silicide can be used to form the metal source and drain layer. The reason for this is that because the high-concentration impurity layer 24 is provided around the metal source and drain layer, the Schottky barrier between the source and drain layer 21 and the channel 15 becomes lower.

When the source and drain are formed in this embodiment, if an impurity is implanted in advance in a shallow portion, and then a metal is sputtered to form a silicide, the impurity existing in portion of the metal source and drain layer 21 is segregated around the metal source and drain layer in the process of silicidation. It is possible to form, for example, the high-concentration impurity layer 24 by this impurity segregation. The impurity for an n-channel device can be phosphorous, arsenic, antimony, sulfur, or a rare earth metal such as erbium, and the impurity for a p-channel device can be boron, indium, or a noble metal such as platinum.

As in the case of the forth embodiment, in this embodiment, it is possible to reliably implant an impurity into an impurity forming region, and to make a self-aligned silicide on the entire portions of the source and drain regions. Accordingly, it is possible to have a uniform impurity profile in a substrate depth direction of a Fin-type channel transistor, thereby considerably decreasing the parasitic resistance.

Although a plurality of Fins are provided in the first to fifth embodiments, only a single Fin can be provided.

Although the silicide layer is formed on the upper surface of the gate electrode in the first to fifth embodiments, the entire portions of the gate electrode can be formed of a silicide.

Sixth Embodiment

Next, a Fin-type channel transistor according to a sixth embodiment of the present invention will be described below. Although an n-type channel device will be described as an example of the Fin-type channel transistor of this embodiment, a p-type channel device can also be manufactured in a similar manner by changing the ion species in the ion implantation step.

Figure 24:
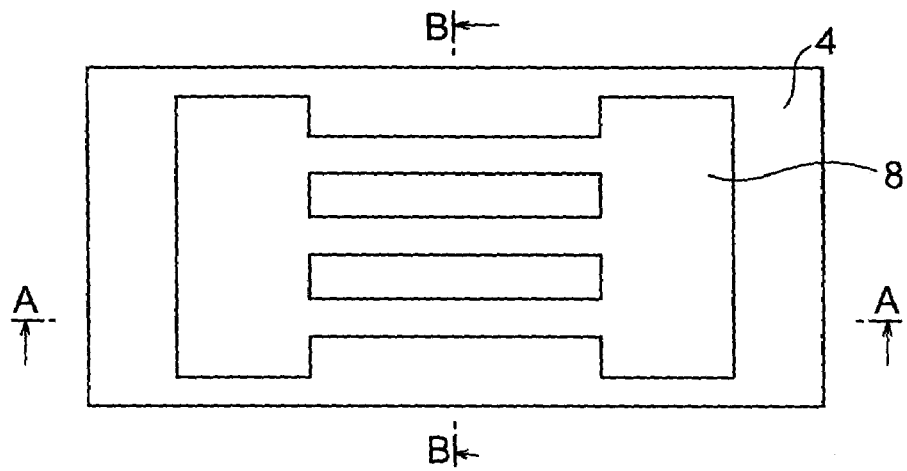
FIG. 24 is a plan view showing a step of a process of manufacturing a Fin-type channel transistor according to a sixth embodiment of the present invention.
Figure 25:
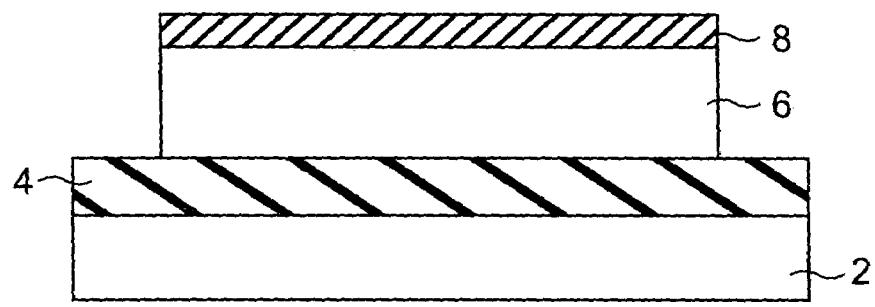
FIG. 25 is a sectional view taken along line A-A of FIG. 24.
Figure 26:
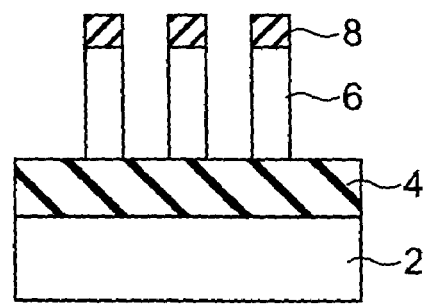
FIG. 26 is a sectional view taken along line B-B of FIG. 24.

First, as shown in FIGS. 24 to 26, an SOI substrate is prepared by forming an insulating film 4 on a support substrate 2 and an SOI layer 6 on the insulating film 4. Thereafter, a silicon nitride layer 8 having a thickness of about 100 nm and serving as a protection layer of a channel is deposited by LPCVD (Low Pressure Chemical Vapor Deposition) or the like, and device isolation is performed using a known device isolation technique. Subsequently, the SOI layer 6 is patterned using a known patterning technique, thereby forming Fins serving as channels. The width of each Fin is, for example, 10 nm. FIG. 24 is a plan view, FIG. 25 is a sectional view taken along line A-A of FIG. 24, and FIG. 26 is a sectional view taken along ling B-B of FIG. 24.

Figure 27:
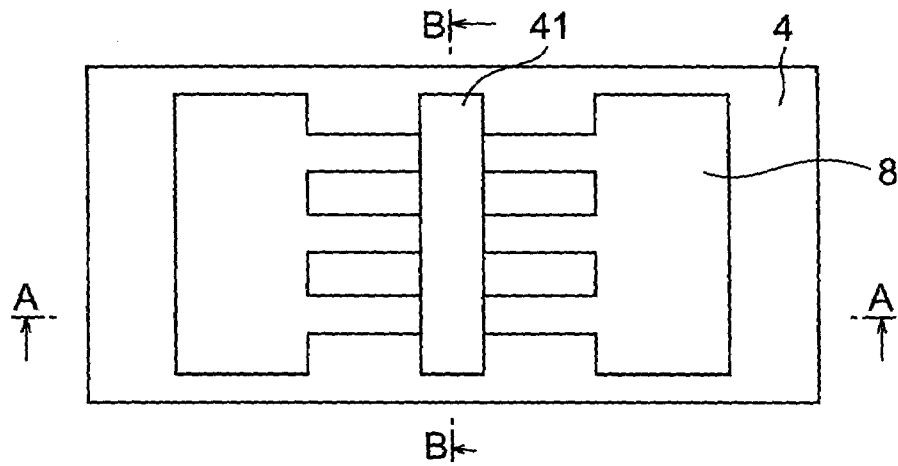
FIG. 27 is a plan view showing a step of a process of manufacturing a Fin-type channel transistor according to a sixth embodiment of the present invention.
Figure 28:
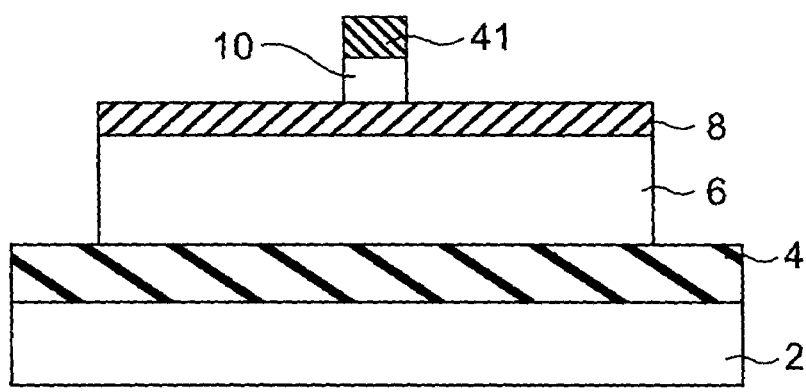
FIG. 28 is a sectional view taken along line A-A of FIG. 27.
Figure 29:
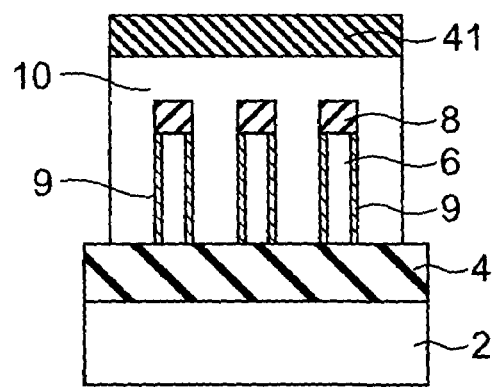
FIG. 29 is a sectional view taken along line B-B of FIG. 27.

Next, as shown in FIGS. 27 to 29, a silicon dioxide layer serving as a gate insulating film 9 having a thickness of about 1 nm is formed by RTO (Rapid Thermal Oxidation) or the like, and then the dielectric constant of the gate insulating film 9 is increased by adding nitrogen by a plasma nitriding treatment. Thereafter, a polycrystalline silicon film serving as a gate electrode 10 is deposited to have a thickness of about 50 nm by LPCVD or the like, and a cap layer 41 having a thickness of 100 nm is deposited thereon. Subsequently, a hard mask layer of silicon nitride (not shown) is deposited. Then, the hard mask layer is patterned using a photolithography technique or the like. Thereafter, the cap layer 41 and the polycrystalline silicon film are patterned by RIE or the like using the patterned hard mask layer as a mask to form the gate electrode portion. There is a case where an offset spacer is further formed, but it is not shown in the drawings. FIG. 27 is a plan view, FIG. 28 is a sectional view taken along line A-A of FIG. 27, and FIG. 29 is a sectional view taken along line B-B of FIG. 27.

Figure 30:
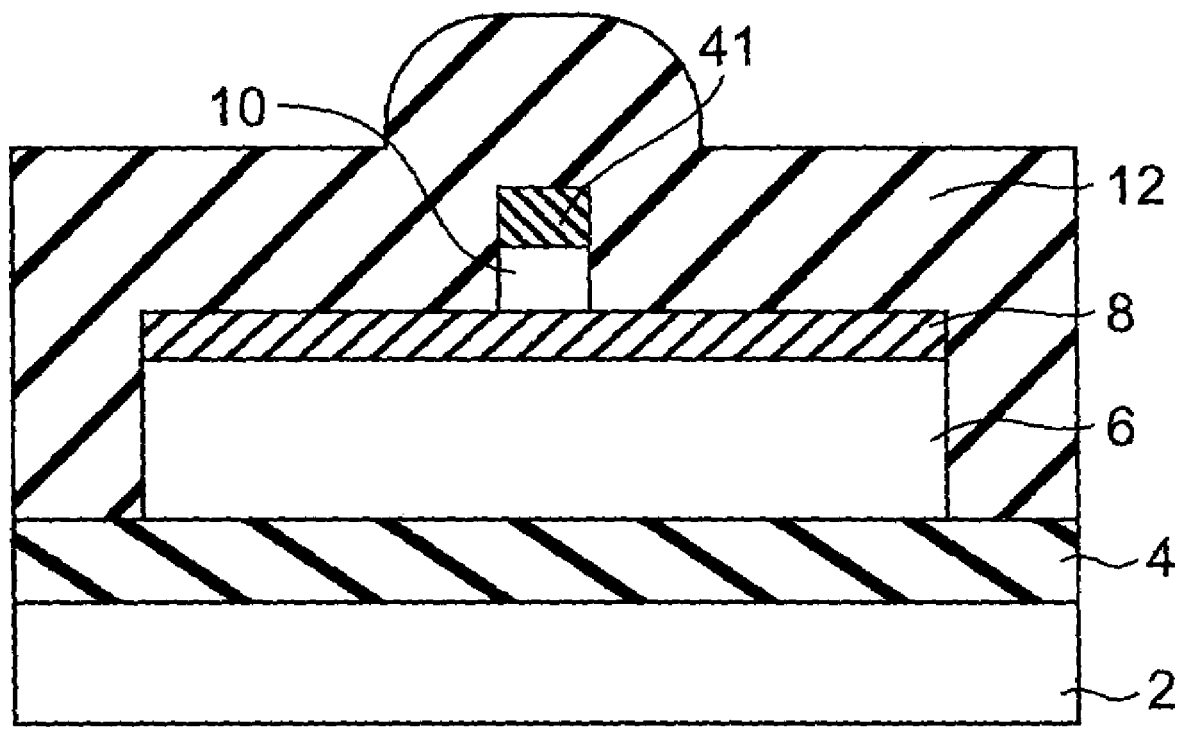
FIG. 30 is a sectional view showing a step of the process of manufacturing a Fin-type channel transistor according to the sixth embodiment of the present invention.
Figure 31:
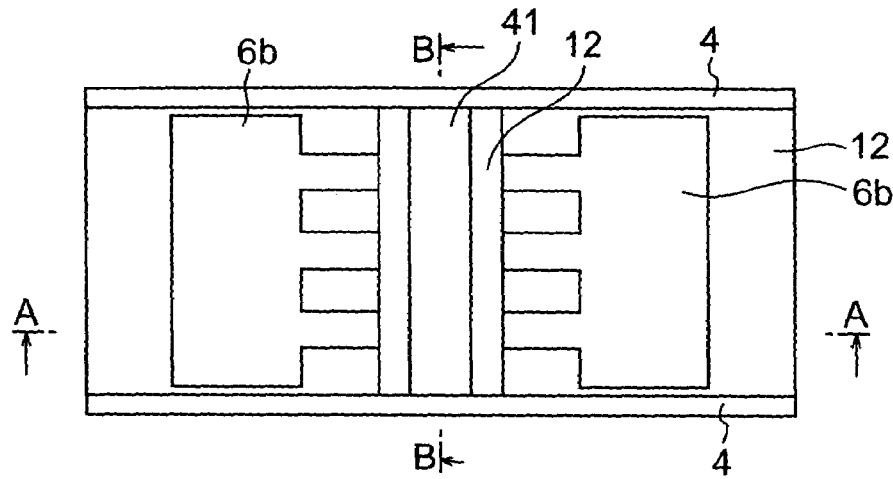
FIG. 31 is a plan view showing a step of the process of manufacturing a Fin-type channel transistor according to the sixth embodiment of the present invention.
Figure 32:
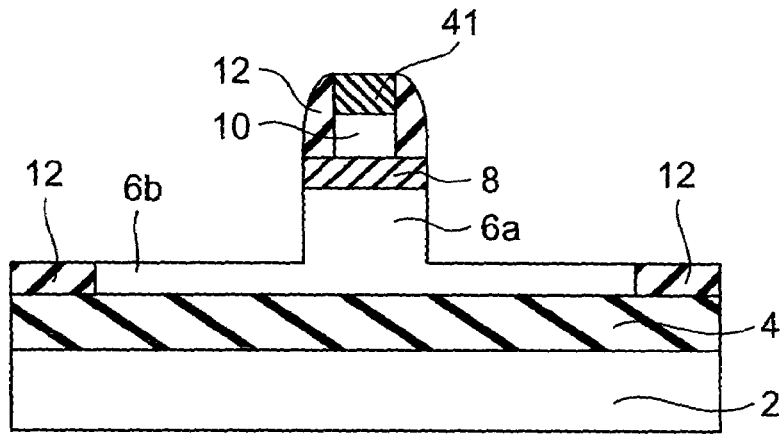
FIG. 32 is a sectional view taken along line A-A of FIG. 31.
Figure 33:
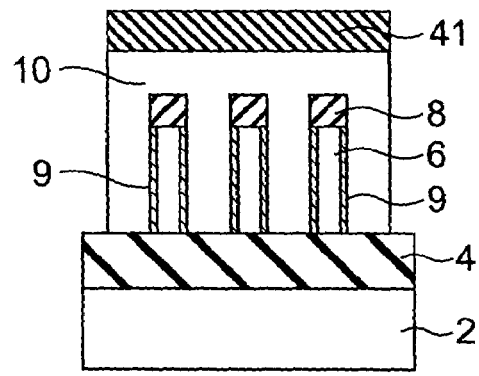
FIG. 33 is a sectional view taken along line B-B of FIG. 31.

Next, as shown in FIG. 30, a silicon nitride layer 12 having a film thickness of 100 nm is deposited by an LPCVD method. FIG. 30 is a sectional view corresponding to FIG. 28. Subsequently, anisotropy etching, e.g., RIE, is performed, thereby patterning the gate sidewall 12 and the Fin portions 6 serving as channels at the same time (FIGS. 31 to 33). In this patterning step, the side portions 6a of the Fin portions, which are in parallel with the gate electrode 10 and perpendicular to the channel direction, are exposed, as shown in FIGS. 31 to 33. In FIGS. 31 and 32, the reference numeral 6b denotes a semiconductor region connected to bottom portions of the channel Fin portions 6a to serve as part of source and drain. FIG. 31 is a plan view, FIG. 32 is a sectional view taken along line A-A of FIG. 31, and FIG. 33 is a sectional view taken along ling B-B of FIG. 31.

Figure 34:
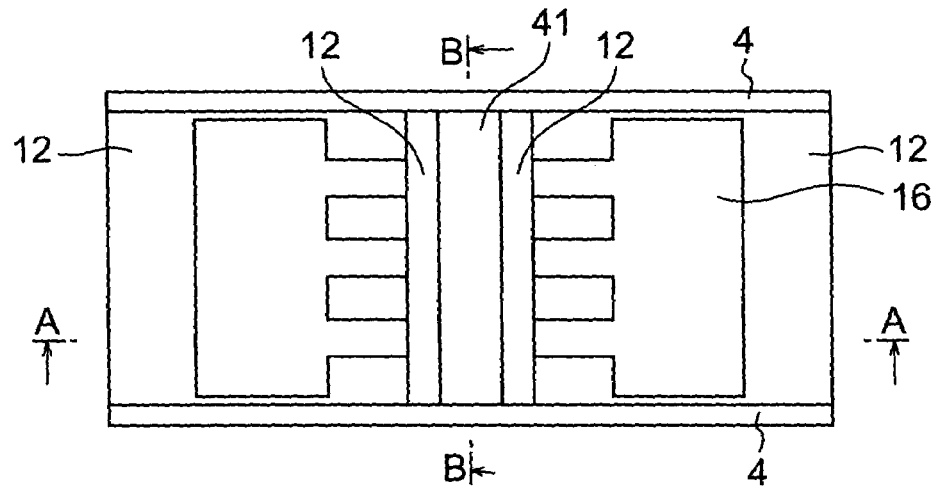
FIG. 34 is a plan view showing a step of the process of manufacturing a Fin-type channel transistor according to the sixth embodiment of the present invention.
Figure 35:
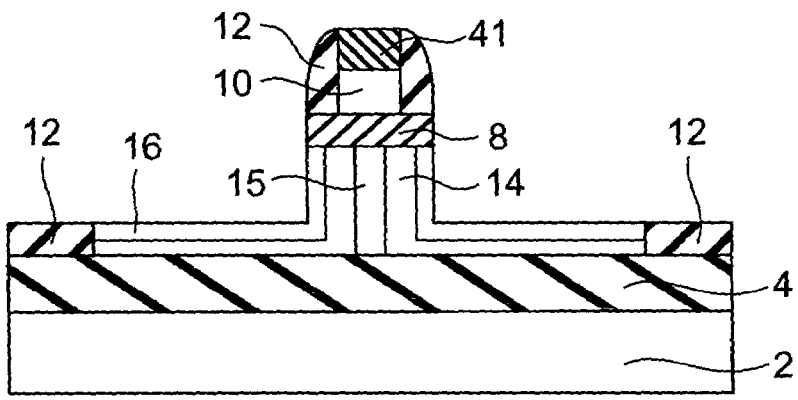
FIG. 35 is a sectional view taken along line A-A of FIG. 34.
Figure 36:
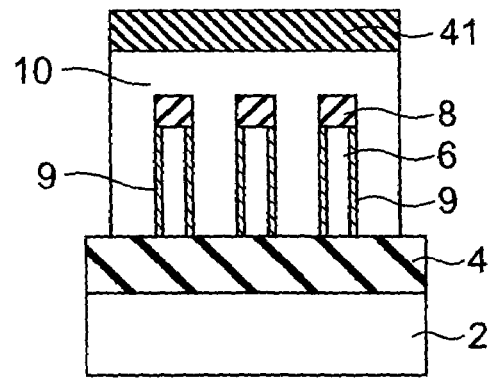
FIG. 36 is a sectional view taken along line B-B of FIG. 34.

Thereafter, as shown in FIGS. 34 to 36, about $1 \times 10^{14}$ cm$^{-2}$ of boron ions are implanted at an acceleration voltage of 1 keV to form a halo region, and then about $2 \times 10^{15}$ cm$^{-2}$ of arsenic ions are implanted at an acceleration voltage of 0.5 keV, to form an extension region, thereby forming a pair of impurity regions 14 serving as part of source and drain. Subsequently, about $3 \times 10^{15}$ cm$^{-2}$ of arsenic ions are implanted at an acceleration voltage 30 keV to form a deep diffusion layer 16. A portion of the semiconductor layer 6a between the pair of impurity formation regions 14 serves as a channel region 15. FIG. 34 is a plan view, FIG. 35 is a sectional view taken along line A-A of FIG. 34, and FIG. 36 is a sectional view taken along line B-B of FIG. 34.

Figure 37:
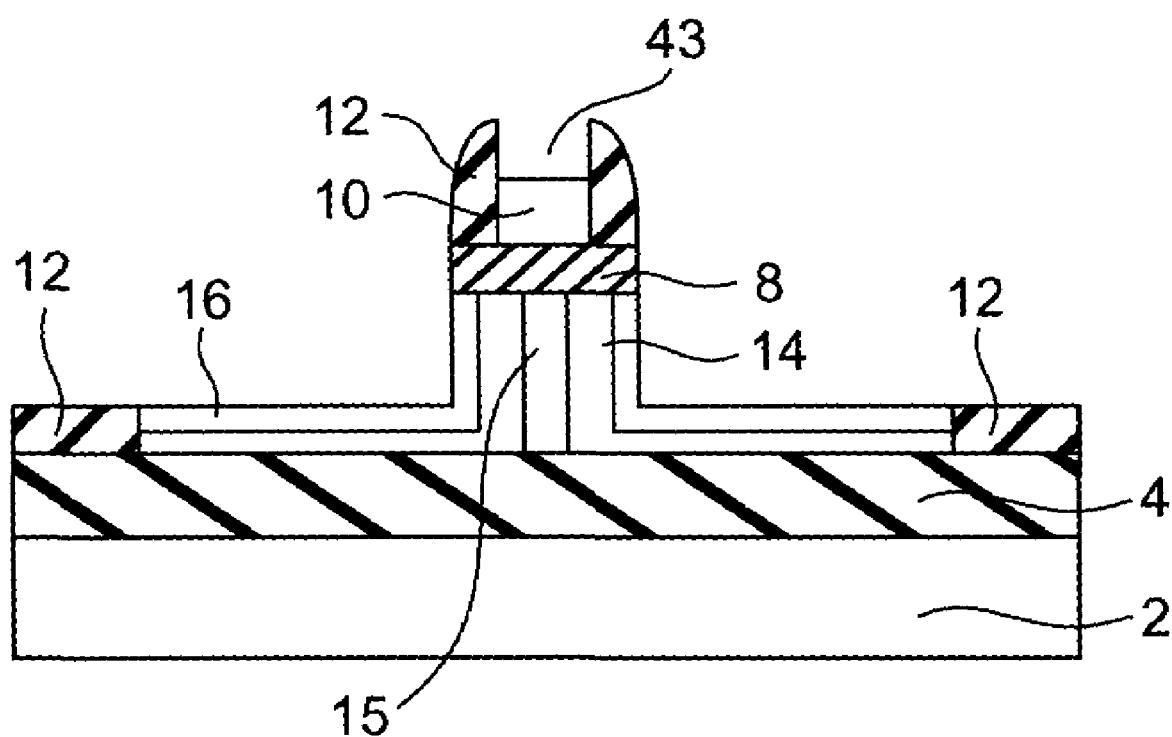
FIG. 37 is a sectional view showing a step of the process of manufacturing a Fin-type channel transistor according to the sixth embodiment of the present invention.

Subsequently, the cap layer 41 of silicon oxide is removed by etching using, e.g., dilute HF solution to expose the surface of the gate electrode 10. As a result, the portion where the cap layer 41 is removed becomes a groove 43, and the gate electrode 10 is surrounded by sidewalls 12 as shown in FIG. 37. By having the sidewalls 12 which are higher than the gate electrode 10 of polycrystalline silicon as shown in the drawing, it is possible to prevent the gate-source and drain bridging caused by a silicide moving over the sidewalls 12 during the silicidation step performed later.

Figure 38:
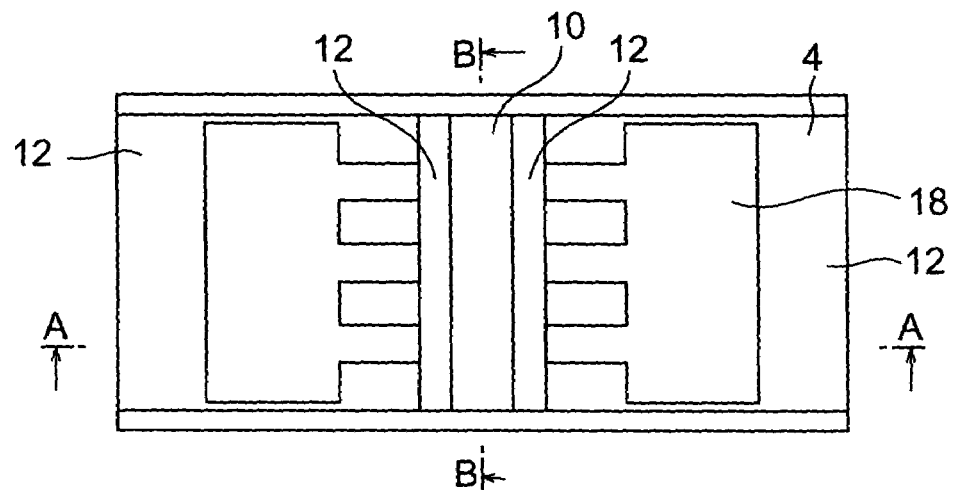
FIG. 38 is a plan view showing a step of the process of manufacturing a Fin-type channel transistor according to the sixth embodiment of the present invention.
Figure 39:
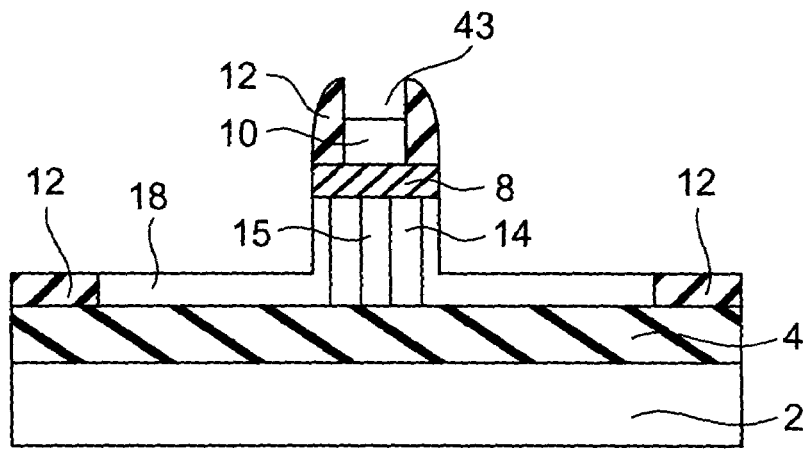
FIG. 39 is a sectional view taken along line A-A of FIG. 38.
Figure 40:
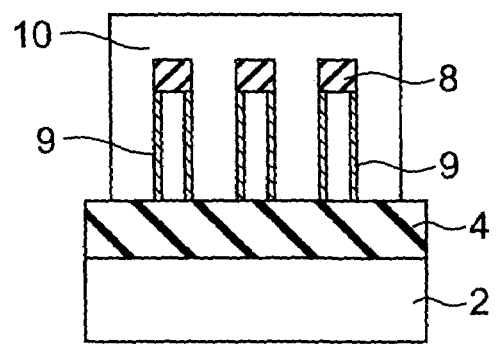
FIG. 40 is a sectional view taken along line B-B of FIG. 38.

Thereafter, sputtering of a high-melting point metal such as Ni and a heat treatment thereof are performed, thereby forming a silicide layer 18 in a self aligned manner in the Fin portions 6a and 6b and forming a full silicide gate electrode 20 in a self aligned manner (FIGS. 38 to 40). Although the entire portion of the deep diffusion layer 16 serving as source and drain is changed to the silicide layer 18 in FIG. 39, only part of the deep diffusion layer 16 can be changed to silicide. FIG. 38 is a plan view, FIG. 39 is a sectional view taken along line A-A of FIG. 38, and FIG. 40 is a sectional view taken along line B-B of FIG. 38.

In this manner, a basic structure of a full silicide gate Fin-type channel transistor according to this embodiment is completed.

Although an activation annealing step etc. is optionally performed after each ion implantation step, descriptions of such a step are omitted.

The halo region should not necessarily be formed, but it is desirable to form it in order to curb the short channel effect.

According to this embodiment, it is possible to reliably implant an impurity into an impurity forming region, and to form a self aligned silicide layer in the entire portions of the source and drain regions. As a result, it is possible to form a uniform impurity profile in a depth direction of the Fin-type channel transistor substrate, to curb the depletion of the gate electrode, and to prevent the gate—source and drain bridging without increasing the height of the gate electrode and decreasing the degree of aspect ratio.

According to embodiments of the present invention, it is possible to reliably implant an impurity into an impurity forming region, and to form a self-aligned silicide layer in the entire portions of the source and drain regions. As a result, it is possible to form a uniform impurity profile in a depth direction of the Fin-type channel transistor substrate, thereby considerably decreasing the parasitic resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A Fin-type channel transistor comprising:
    a first semiconductor layer of a first conductivity type in a substantially a rectangular solid shape formed on a substrate;
    a gate electrode formed on a pair of first side portions of the first semiconductor layer facing to each other with a gate insulating film being placed between the gate electrode and the first side portions;
    a second semiconductor layer of the first conductivity type connected to bottom portions of a pair of second side portions of the first semiconductor layer placed in a substantially perpendicular direction with respect to the first side portions, the second semiconductor layer extending along the substantially perpendicular direction;
    a first impurity region of a second conductivity type formed in the second semiconductor layer;
    second impurity regions formed on the pair of side portions of the first semiconductor layer and connected to the first impurity region; and
    a channel region formed between the second impurity regions of the first semiconductor layer.

2. The Fin-type channel transistor according to claim 1, wherein a protection layer of an insulating material is formed on an upper surface of the first semiconductor layer, the gate electrode formed on the pair of first side portions of the first semiconductor layer extends on the protection layer, and sidewalls of an insulating material are formed on side portions of the gate electrode which are in parallel with the second side portions of the first semiconductor layer.

3. The Fin-type channel transistor according to claim 1, wherein the first semiconductor layer includes a plurality of first semiconductor layers arranged in a line in a direction perpendicular to the pair of first side portions, portions of the gate electrode being inserted between adjacent semiconductor layers.

4. The Fin-type channel transistor according to claim 1, wherein the substrate is an SOI substrate, the first impurity region is formed in an SOI layer of the SOI substrate, and the second impurity regions are of the second conductivity type.

5. The Fin-type channel transistor according to claim 1, wherein the substrate is a bulk silicon substrate, and the first impurity region is formed in the bulk silicon substrate.

6. The Fin-type channel transistor according to claim 1, wherein a silicon or silicon germanium epitaxial layer is formed on a surface of the first impurity region, and all or part thereof is changed to a silicide or germano-silicide.

7. The Fin-type channel transistor according to claim 1, wherein a metal layer having a Schottky junction with the first semiconductor layer is formed as source and drain.

8. The Fin-type channel transistor according to claim 7, wherein when the Fin-type channel transistor has a n type channel, the metal layer is formed of a rare earth metal or a silicide containing a rare earth metal, and when the Fin-type channel transistor has a p type channel, the metal layer is formed of a noble metal or a silicide containing a noble metal.

9. The Fin-type channel transistor according to claim 8, wherein the second impurity regions are halo regions of the first conductivity type.

10. The Fin-type channel transistor according to claim 7, wherein the second impurity region is an impurity region of the second conductivity type having substantially the same impurity concentration as the first impurity region.

11. The Fin-type channel transistor according to claim 1, wherein the gate electrode is formed of a metal or a metal silicide.

* * * * *